US009064684B1

(12) United States Patent
Mui et al.

(10) Patent No.: US 9,064,684 B1
(45) Date of Patent: Jun. 23, 2015

(54) FLOWABLE OXIDE DEPOSITION USING RAPID DELIVERY OF PROCESS GASES

(75) Inventors: Collin K. L. Mui, Mountain View, CA (US); Lakshminarayana Nittala, Sunnyvale, CA (US); Nerissa Draeger, Fremont, CA (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 13/607,511

(22) Filed: Sep. 7, 2012

Related U.S. Application Data

(62) Division of application No. 12/566,085, filed on Sep. 24, 2009, now Pat. No. 8,278,224.

(51) Int. Cl.
| | |
|---|---|
| *B05C 11/00* | (2006.01) |
| *H01L 21/00* | (2006.01) |
| *H01L 21/02* | (2006.01) |
| *B05C 1/00* | (2006.01) |

(52) U.S. Cl.
CPC .......... *H01L 21/00* (2013.01); *H01L 21/02107* (2013.01); *B05C 11/00* (2013.01); *B05C 1/00* (2013.01)

(58) Field of Classification Search
USPC ........................................................ 118/697
See application file for complete search history.

(56) References Cited

U.S. PATENT DOCUMENTS

| | | | |
|---|---|---|---|
| 4,099,990 A | 7/1978 | Brown et al. | |
| 4,740,480 A | 4/1988 | Ooka | |
| 4,923,720 A * | 5/1990 | Lee et al. | 427/422 |
| 5,281,274 A * | 1/1994 | Yoder | 118/697 |
| 5,320,983 A | 6/1994 | Ouellet | |
| 5,387,546 A | 2/1995 | Maeda et al. | |
| 5,516,721 A | 5/1996 | Galli et al. | |
| 5,525,157 A * | 6/1996 | Hawkins et al. | 118/715 |
| 5,534,731 A | 7/1996 | Cheung | |

(Continued)

FOREIGN PATENT DOCUMENTS

| | | |
|---|---|---|
| CN | 1722403 A | 1/2006 |
| EP | 1 063 692 A1 | 12/2000 |

(Continued)

OTHER PUBLICATIONS

Siber, V. et al. "Claiming Computer-Related Articles of Manufacture" in IDEA: The Journal of Law and Technology 1994-1995 pp. 13-35.*

(Continued)

*Primary Examiner* — Eva Y Montalvo
*Assistant Examiner* — Grant Withers
(74) *Attorney, Agent, or Firm* — Weaver Austin Villeneuve & Sampson LLP

(57) ABSTRACT

Methods and apparatus for filling gaps on partially manufactured semiconductor substrates with dielectric material are provided. In certain embodiments, the methods include introducing a first process gas into the processing chamber and accumulating a second process gas in an accumulator maintained at a pressure level substantially highest than that of the processing chamber pressure level. The second process gas is then rapidly introduced from the accumulator into the processing chamber. An excess amount of the second process gas may be provided in the processing chamber during the introduction of the second process gas. Flowable silicon-containing films forms on a surface of the substrate to at least partially fill the gaps.

19 Claims, 10 Drawing Sheets

(56) References Cited

U.S. PATENT DOCUMENTS

| | | | |
|---|---|---|---|
| 5,747,381 A | 5/1998 | Wu et al. | |
| 5,807,785 A * | 9/1998 | Ravi | 438/624 |
| 5,840,631 A | 11/1998 | Kubo et al. | |
| 5,858,880 A | 1/1999 | Dobson et al. | |
| 5,874,367 A | 2/1999 | Dobson | |
| 5,899,751 A | 5/1999 | Chang et al. | |
| 5,902,127 A | 5/1999 | Park | |
| 5,932,289 A | 8/1999 | Dobson et al. | |
| 5,990,013 A | 11/1999 | Berenguer et al. | |
| 6,013,581 A | 1/2000 | Wu et al. | |
| 6,054,379 A | 4/2000 | Yau et al. | |
| 6,060,384 A | 5/2000 | Chen et al. | |
| 6,072,227 A | 6/2000 | Yau et al. | |
| 6,114,224 A | 9/2000 | Ngo et al. | |
| 6,114,259 A | 9/2000 | Sukharev et al. | |
| 6,143,626 A | 11/2000 | Yabu et al. | |
| 6,207,535 B1 | 3/2001 | Lee et al. | |
| 6,218,268 B1 | 4/2001 | Xia et al. | |
| 6,242,366 B1 | 6/2001 | Beekman et al. | |
| 6,287,989 B1 | 9/2001 | Dobson | |
| 6,300,219 B1 | 10/2001 | Doan et al. | |
| 6,309,933 B1 | 10/2001 | Li et al. | |
| 6,323,123 B1 | 11/2001 | Liu et al. | |
| 6,383,951 B1 | 5/2002 | Li | |
| 6,399,213 B2 | 6/2002 | Shiokawa | |
| 6,413,583 B1 | 7/2002 | Moghadam et al. | |
| 6,448,187 B2 | 9/2002 | Yau et al. | |
| 6,475,564 B1 | 11/2002 | Carter et al. | |
| 6,544,858 B1 | 4/2003 | Beekman et al. | |
| 6,635,586 B2 | 10/2003 | Goo et al. | |
| 6,640,840 B1 | 11/2003 | MacNeil | |
| 6,653,247 B2 | 11/2003 | MacNeil | |
| 6,660,663 B1 | 12/2003 | Cheung et al. | |
| 6,743,436 B1 | 6/2004 | Lee et al. | |
| 6,743,736 B2 * | 6/2004 | Mardian et al. | 438/758 |
| 6,787,463 B2 * | 9/2004 | Mardian et al. | 438/680 |
| 6,790,737 B2 | 9/2004 | Schneegans et al. | |
| 6,812,135 B2 | 11/2004 | Li et al. | |
| 6,828,162 B1 | 12/2004 | Halliyal et al. | |
| 6,846,757 B2 | 1/2005 | MacNeil | |
| 6,858,195 B2 | 2/2005 | Aronowitz et al. | |
| 6,902,947 B2 | 6/2005 | Chinn et al. | |
| 6,972,262 B2 | 12/2005 | Lee et al. | |
| 6,984,561 B2 | 1/2006 | Herner et al. | |
| 6,995,056 B2 | 2/2006 | Lee et al. | |
| 7,033,945 B2 | 4/2006 | Byun et al. | |
| 7,056,560 B2 | 6/2006 | Yim et al. | |
| 7,071,126 B2 | 7/2006 | Johnston et al. | |
| 7,074,690 B1 | 7/2006 | Gauri et al. | |
| 7,074,727 B2 | 7/2006 | Hsu et al. | |
| 7,084,505 B2 | 8/2006 | Hamada et al. | |
| 7,153,783 B2 | 12/2006 | Lu et al. | |
| 7,211,525 B1 | 5/2007 | Shanker et al. | |
| 7,238,604 B2 | 7/2007 | Kloster et al. | |
| 7,365,000 B2 | 4/2008 | Lee et al. | |
| 7,498,273 B2 | 3/2009 | Mallick et al. | |
| 7,521,378 B2 | 4/2009 | Fucsko et al. | |
| 7,524,735 B1 | 4/2009 | Gauri et al. | |
| 7,575,633 B2 * | 8/2009 | Romanin | 118/257 |
| 7,582,555 B1 | 9/2009 | Lang et al. | |
| 7,585,704 B2 | 9/2009 | Belyansky et al. | |
| 7,589,012 B1 | 9/2009 | Seo et al. | |
| 7,622,369 B1 | 11/2009 | Lee et al. | |
| 7,629,227 B1 | 12/2009 | Wang et al. | |
| 7,655,532 B1 | 2/2010 | Chen et al. | |
| 7,727,906 B1 | 6/2010 | Shanker et al. | |
| 7,794,544 B2 | 9/2010 | Nguyen et al. | |
| 7,804,130 B1 | 9/2010 | Fung | |
| 7,825,044 B2 | 11/2010 | Mallick et al. | |
| 7,888,233 B1 | 2/2011 | Gauri et al. | |
| 7,888,273 B1 | 2/2011 | Wang et al. | |
| 7,915,139 B1 | 3/2011 | Lang et al. | |
| 8,187,951 B1 * | 5/2012 | Wang et al. | 438/452 |
| 8,278,224 B1 | 10/2012 | Mui et al. | |
| 8,481,403 B1 | 7/2013 | Gauri et al. | |
| 8,557,712 B1 | 10/2013 | Antonelli et al. | |
| 8,580,697 B1 | 11/2013 | Lang et al. | |
| 8,685,867 B1 | 4/2014 | Danek et al. | |
| 8,728,958 B2 | 5/2014 | Ashtiani et al. | |
| 8,809,161 B2 | 8/2014 | Gauri et al. | |
| 8,846,536 B2 | 9/2014 | Draeger et al. | |
| 2002/0006729 A1 | 1/2002 | Geiger et al. | |
| 2003/0040199 A1 | 2/2003 | Agarwal | |
| 2003/0066482 A1 * | 4/2003 | Pokharna et al. | 118/696 |
| 2003/0077887 A1 | 4/2003 | Jang et al. | |
| 2003/0146416 A1 | 8/2003 | Takei et al. | |
| 2003/0159655 A1 | 8/2003 | Lin et al. | |
| 2003/0194861 A1 * | 10/2003 | Mardian et al. | 438/680 |
| 2003/0210065 A1 | 11/2003 | Lu et al. | |
| 2004/0048455 A1 | 3/2004 | Karasawa et al. | |
| 2004/0152342 A1 | 8/2004 | Li et al. | |
| 2004/0169005 A1 | 9/2004 | Kim et al. | |
| 2004/0224496 A1 | 11/2004 | Cui et al. | |
| 2005/0026443 A1 | 2/2005 | Goo et al. | |
| 2005/0112282 A1 | 5/2005 | Gordon | |
| 2005/0136684 A1 * | 6/2005 | Mukai et al. | 438/778 |
| 2005/0150453 A1 * | 7/2005 | Simmons et al. | 118/715 |
| 2005/0181566 A1 | 8/2005 | Machida et al. | |
| 2005/0212179 A1 | 9/2005 | Honda et al. | |
| 2005/0260864 A1 | 11/2005 | Huang et al. | |
| 2006/0014384 A1 | 1/2006 | Lee et al. | |
| 2006/0024912 A1 | 2/2006 | Lee | |
| 2006/0216946 A1 | 9/2006 | Usami et al. | |
| 2006/0223290 A1 | 10/2006 | Belyansky et al. | |
| 2006/0269693 A1 | 11/2006 | Balseanu et al. | |
| 2006/0270217 A1 | 11/2006 | Balseanu et al. | |
| 2007/0054505 A1 | 3/2007 | Antonelli et al. | |
| 2007/0281495 A1 | 12/2007 | Mallick et al. | |
| 2007/0298585 A1 | 12/2007 | Lubomirsky et al. | |
| 2008/0020591 A1 | 1/2008 | Balseanu et al. | |
| 2008/0081434 A1 | 4/2008 | Nam et al. | |
| 2008/0132087 A1 | 6/2008 | Xia et al. | |
| 2009/0020847 A1 | 1/2009 | Byun et al. | |
| 2009/0053895 A1 | 2/2009 | Oshima et al. | |
| 2009/0061647 A1 | 3/2009 | Mallick et al. | |
| 2009/0104789 A1 | 4/2009 | Mallick et al. | |
| 2009/0104790 A1 | 4/2009 | Liang | |
| 2009/0298257 A1 | 12/2009 | Lee et al. | |
| 2009/0321936 A1 * | 12/2009 | Kojima et al. | 257/751 |
| 2010/0109155 A1 | 5/2010 | Liu et al. | |
| 2010/0167533 A1 | 7/2010 | Lim et al. | |
| 2011/0081782 A1 | 4/2011 | Liang et al. | |
| 2011/0151678 A1 | 6/2011 | Ashtiani et al. | |
| 2012/0149213 A1 | 6/2012 | Nittala et al. | |
| 2012/0161405 A1 | 6/2012 | Mohn et al. | |
| 2012/0164328 A1 * | 6/2012 | Kojima et al. | 427/250 |
| 2013/0122718 A1 * | 5/2013 | Kato et al. | 438/758 |
| 2013/0230987 A1 | 9/2013 | Draeger et al. | |
| 2014/0017904 A1 | 1/2014 | Gauri et al. | |
| 2014/0302689 A1 | 10/2014 | Ashtiani et al. | |

FOREIGN PATENT DOCUMENTS

| | | |
|---|---|---|
| JP | 2001-148382 | 5/2001 |
| JP | 2010-153859 | 7/2010 |
| WO | WO 2007/140376 | 12/2007 |
| WO | WO 2007/140424 | 12/2007 |
| WO | 2011072143 | 6/2011 |

OTHER PUBLICATIONS

U.S. Office Action mailed Aug. 23, 2005, from U.S. Appl. No. 10/810,066.

Lang et al., "CVD Flowable Gap Fill," Novellus Systems, Inc., U.S. Appl. No. 11/323,812, filed Dec. 29, 2005, pp. 1-21.

Notice of Allowance and Fee Due mailed Feb. 15, 2006 from U.S. Appl. No. 10/810,066.

Gauri et al., "Flowable Film Dielectric Gap Fill Process," Novellus Systems, Inc., U.S. Appl. No. 11/447,594, filed Jun. 5, 2006.

U.S. Office Action mailed Jun. 27, 2008, from U.S. Appl. No. 11/447,594.

U.S. Office Action mailed Oct. 26, 2007, from U.S. Appl. No. 11/323,812.

(56) References Cited

OTHER PUBLICATIONS

U.S. Office Action mailed Apr. 9, 2008, from U.S. Appl. No. 11/323,812.
U.S. Office Action mailed Oct. 9, 2008, from U.S. Appl. No. 11/323,812.
Wang, et al., "CVD Flowable Gap Fill," Novellus Systems, Inc., U.S. Appl. No. 11/925,514, filed Oct. 26, 2007.
Wang, et al., "Density Gradient-Free Gap Fill," Novellus Systems, Inc., U.S. Appl. No. 11/834,581, filed Aug. 6, 2007.
Notice of Allowance and Fee Due mailed Dec. 11, 2008, from U.S. Appl. No. 11/447,594.
U.S. Office Action mailed Nov. 4, 2008, from U.S. Appl. No. 11/925,514.
U.S. Office Action mailed Nov. 12, 2008, from U.S. Appl. No. 11/834,581.
Antonelli et al., "PECVD Flowable Dielectric Gap Fill," Novellus Systems, Inc., U.S. Appl. No. 12/334,726, filed Dec. 15, 2008.
Gauri et al., "Flowable Film Dielectric Gap Fill Process," Novellus Systems, Inc., U.S. Appl. No. 12/411,243, filed Mar. 25, 2009.
Notice of Allowance and Fee Due mailed Apr. 23, 2009 from U.S. Appl. No. 11/323,812.
U.S. Final Office Action mailed Jun. 17, 2009, from U.S. Appl. No. 11/925,514.
Notice of Allowance and Fee Due mailed Jul. 29, 2009 from U.S. Appl. No. 11/925,514.
Mui et al., "Flowable Oxide Deposition Using Rapid Delivery of Process Gases," Novellus Systems, Inc., U.S. Appl. No. 12/566,085, filed Sep. 24, 2009.
Lang et al., "CVD Flowable Gap Fill", Novellus Systems, Inc., U.S. Appl. No. 12/508,461, filed Jul. 23, 2009.
Chung, et al., "Flowable Oxide CVD Process for Shallow Trench Isolation in Silicon Semiconductor," Journal of Semiconductor Technology and Science, vol. 4, No. 1, Mar. 2004, pp. 45-51.
U.S. Final Office Action mailed Aug. 6, 2009, from U.S. Appl. No. 11/834,581.
U.S. Office Action mailed Dec. 18, 2009, from U.S. Appl. No. 11/834,581.
Wang et al., "CVD Flowable Gap Fill", Novellus Systems, Inc., U.S. Appl. No. 12/625,468, filed Nov. 24, 2009.
U.S. Office Action mailed Feb. 26, 2010, from U.S. Appl. No. 12/334,726.
U.S. Final Office Action mailed Apr. 22, 2010, for U.S. Appl. No. 11/834,581.
U.S. Office Action mailed May 24, 2010, for U.S. Appl. No. 12/411,243.
U.S. Final Office Action mailed Sep. 13, 2010 for U.S. Appl. No. 12/411,243.
U.S. Final Office Action mailed Oct. 26, 2010 for U.S. Appl. No. 12/334,726.
Notice of Allowance mailed Oct. 6, 2010 for U.S. Appl. No. 12/411,243.
Notice of Allowance mailed Nov. 18, 2010 for U.S. Appl. No. 12/508,461.
Notice of Allowance mailed Oct. 7, 2010 for U.S. Appl. No. 11/834,581.
Ashtiani et al., "Novel Gap Fill Integration," Novellus Systems, Inc., U.S. Appl. No. 12/964,110, filed Dec. 9, 2010.
Lang et al., "CVD Flowable Gap Fill", Novellus Systems, Inc., U.S. Appl. No. 13/031,077, filed Feb. 18, 2011.
Matsuura, M., et al., "Novel Self-Planarizing CVD Oxide for Interlayer Dielectric Applications," IEEE, 1994, pp. 117-120.
Hatanaka, M., et al., "$H_2O$-TEOS Plasma-CVD Realizing Dielectrics Having a Smooth Surface," IEEE, VMIC Conference, Jun. 11-12, 1991, pp. 435-441.
Sakaue, H., et al., "Digital Chemical Vapor Deposition of $SiO_2$ Using a Repetitive Reaction of Triethylsilane /Hydrogen and Oxidation," Department of Electrical Engineering, Hiroshima University, published Nov. 17, 1990, pp. L 124-L 127.

Nakano, M., et al., "Digital CVD of $SiO_2$," Extended Abstracts of the $21^{st}$ Conference on Solid State Devices and Materials, Tokyo, 1989, pp. 49-52.
Noguchi, S., et al., "Liquid Phase Oxidation Employing O Atoms Produced by Microwave Discharge and $Si(CH_3)_4$," Extended Abstracts of the $19^{th}$ Conference on Solid State Devices and Materials, Tokyo, 1987, pp. 451-454.
Chung, Sung-Woong, et al., "Novel Shallow Trench Isolation Process Using Flowable Oxide CVD for sub-100nm DRAM," IEEE, 2002, IEDM, pp. 233-236.
U.S. Office Action for U.S. Appl. No. 12/625,468 mailed Apr. 26, 2011.
Gauri et al., "Flowable Film Dielectric Gap Fill Process," Novellus Systems, Inc., U.S. Appl. No. 12/984,524, filed Jan. 4, 2011.
International Search Report and Written Opinion mailed Aug. 10, 2011 for Application No. PCT/US2010/059721.
U.S. Office Action for U.S. Appl. No. 12/334,726 mailed Sep. 16, 2011.
U.S. Final Office Action for U.S. Appl. No. 12/625,468 mailed Oct. 14, 2011.
Wang, et al., "Density Gradient-Free Gap Fill," Novellus Systems, Inc., U.S. Appl. No. 12/986,070, filed Jan. 6, 2011.
U.S. Office Action for U.S. Appl. No. 12/986,070 mailed Nov. 25, 2011.
Danek, et al., "Premetal Dielectric Integration Process," Novellus Systems, Inc., U.S. Appl. No. 13/315,123, filed Dec. 8, 2011.
Nittala, et al., "Bottom Up Fill in High Aspect Ratio Trenches," Novellus Systems, Inc., U.S. Appl. No. 13/313,735, filed Dec. 7, 2011.
Notice of Allowance for U.S. Appl. No. 12/625,468 mailed Jan. 31, 2012.
U.S. Final Office Action for U.S. Appl. No. 12/334,726 mailed Mar. 30, 2012.
U.S. Office Action for U.S. Appl. No. 12/984,524 mailed May 18, 2012.
Notice of Allowance for U.S. Appl. No. 12/566,085 mailed May 29, 2012.
Draeger, et al., "Flowable Oxide Film With Tunable Wet Etch Rate," Novellus Systems, Inc., U.S. Appl. No. 13/493,936, filed Jun. 11, 2012.
Notice of Allowance for U.S. Appl. No. 13/031,077 mailed Aug. 6, 2012.
U.S. Final Office Action for U.S. Appl. No. 12/986,070 mailed Jun. 25, 2012.
U.S. Appl. No. 12/984,524, filed Jul. 3, 2013 entitled "Flowable Film Dielectric Gap Fill Process".
U.S. Appl. No. 13/461,287, filed May 1, 2012, entitled "CVD Flowable Gap Fill".
US Final Office Action, dated Sep. 14, 2012, issued in U.S. Appl. No. 12/984,524.
US Notice of Allowance, dated Mar. 7, 2013, issued in U.S. Appl. No. 12/984,524.
US Notice of Allowance, dated Jul. 8, 2013, issued in U.S. Appl. No. 13/031,077.
US Office Action, dated Aug. 15, 2013, issued in U.S. Appl. No. 13/461,287.
US Notice of Allowance, dated Jun. 10, 2013, issued in U.S. Appl. No. 12/334,726.
US Office Action, dated Dec. 21, 2012, issued in U.S. Appl. No. 12/964,110.
US Final Office Action, dated Sep. 12, 2013, issued in U.S. Appl. No. 12/964,110.
US Office Action, dated Dec. 6, 2012, issued in U.S. Appl. No. 13/315,123.
US Office Action, dated Jul. 15, 2013, issued in U.S. Appl. No. 13/315,123.
US Office Action, dated Sep. 12, 2013, issued in U.S. Appl. No. 13/493,936.
U.S. Appl. No. 14/519,400, filed Oct. 21, 2014, entitled "Treatment for Flowable Dielectric Deposition on Substrate Surfaces."
U.S. Appl. No. 14/519,712, filed Oct. 21, 2014, entitled "Methods and Apparatus for Forming Flowable Dielectric Films Having Low Porosity."

(56) References Cited

OTHER PUBLICATIONS

U.S. Appl. No. 14/464,071, filed Aug. 20, 2014, entitled "Flowable Dielectric for Selective Ultra Low-K Pore Sealing."
U.S. Appl. No. 14/464,196, filed Aug. 20, 2014, entitled "Low-K Oxide Deposition by Hydrolysis and Condensation."
U.S. Appl. No. 14/466,222, filed Aug. 22, 2014, entitled "Flowable Oxide Film With Tunable Wet Etch Rate".
US Office Action, dated Dec. 16, 2013, issued in U.S. Appl. No. 13/935,398.
US Notice of Allowance, dated Apr. 11, 2014, issued in U.S. Appl. No. 13/935,398.
US Office Action, dated Feb. 28, 2014, issued in U.S. Appl. No. 13/461,287.
US Final Office Action, dated Aug. 26, 2014, issued in U.S. Appl. No. 13/461,287.
US Notice of Allowance, dated May 29, 2012, issued in U.S. Appl. No. 12/566,085.
US Notice of Allowance, dated Jun. 21, 2012, issued in U.S. Appl. No. 12/566,085.
US Notice of Allowance, dated Dec. 27, 2013, issued in U.S. Appl. No. 12/964,110.
US Notice of Allowance, dated Apr. 23, 2014, issued in U.S. Appl. No. 12/964,110.
US Notice of Allowance, dated Nov. 8, 2013, issued in U.S. Appl. No. 13/315,123.
US Office Action, dated Nov. 8, 2013, issued in U.S. Appl. No. 13/313,735.
US Final Office Action, dated Jul. 29, 2014, issued in U.S. Appl. No. 13/313,735.
US Office Action, dated Oct. 10, 2014, issued in U.S. Appl. No. 13/313,735.
US Final Office Action, dated Feb. 3, 2014, issued in U.S. Appl. No. 13/493,936.
US Notice of Allowance, dated May 22, 2014, issued in U.S. Appl. No. 13/493,936.
Japanese Office Action dated Sep. 17, 2013 issued in JP2009-282737.
Japanese Office Action dated Jun. 3, 2014 issued in JP2009-282737.
PCT International Preliminary Report on Patentability and Written Opinion dated Jun. 21, 2012 issued in PCT/US2010/059721.
Chinese First Office Action dated Feb. 8, 2014 issued in CN 2010-80055670.3.
Bekiari, V. et al. (1998) "Characterization of Photoluminescence from a Material Made by Interaction of (3-Aminopropyl)triethoxysilane with Acetic Acid," Langmuir, 14(13):3459-3461.
Brankova et al. (2003) "Photoluminescence from Sol-Gel Organic/Inorganic Hybrid Gels Obtained through Carboxylic Acid Solvolysis," Chem. Mater., 15(9):1855-1859.
Chung, Sung-Woong et al. (Mar. 2004) "Flowable Oxide CVD Process for Shallow Trench Isolation in Silicon Semiconductor," Journal of Semiconductor Technology and Science, 4(1):45-51.
Fessenden et al. (1961) "The Chemistry of Silicon-Nitrogen Compounds," Chem. Rev. 61(4)361-388.
Kessler et al.(2006) "New insight in the role of modifying ligands in the sol-gel processing of metal alkoxide precursors: A possibility to approach new classes of materials," J. Sol-Gel Sci. Techn. 40(2-3):163-179.
Stathatos et al. (Jul. 19, 2003) "Study of Acetic Acid-Catalyzed Nanocomposite Organic/Inorganic Ureasil Sol-Gel Ionic Conductors," Langmuir, 19:(18)7587-7591.

\* cited by examiner

FLOWABLE OXIDE DEPOSITION USING RAPID DELIVERY OF PROCESS GASES

CROSS REFERENCE TO RELATED APPLICATION

This application is a divisional of and claims priority to U.S. patent application Ser. No. 12/566,085, filed Sep. 24, 2009 and titled "FLOWABLE OXIDE DEPOSITION USING RAPID DELIVERY OF PROCESS GASES," all of which is incorporated herein by this reference for all purposes.

BACKGROUND

This invention relates to electronic device fabrication processes. More specifically, the invention relates to chemical vapor deposition processes for forming dielectric layers in high aspect ratio, narrow width recessed features.

It is often necessary in semiconductor processing to fill a trench or a high aspect ratio gaps with insulating material. This is the case for shallow trench isolation (STI) layers, inter-metal dielectric (IMD) layers, inter-layer dielectric (ILD) layers, passivation layers, etc. As device geometries shrink and thermal budgets are reduced, void-free filling or uniform lining of high aspect ratio spaces (e.g., AR>6:1) becomes increasingly difficult due to limitations of existing deposition processes.

One approach to gap fill is high-density plasma chemical vapor deposition (HDP CVD). HDP CVD is a directional (bottom-up) CVD process that is used for high aspect ratio gap-fill. The method deposits more material at the bottom of a high aspect ratio structure than on its sidewalls, which is accomplished by directing charged dielectric precursor species downward, to the bottom of the gap, while simultaneously removing deposited material from the trench top through sputtering using the biased RF power applied to the substrate. Nevertheless, HDP CVD gap fill results in the formation of cusps, also known as overhangs, at the entry region of the gap to be filled. This results from the non-directional deposition reactions of species in the plasma reactor and from sputtering and re-deposition processes. The directional aspect of the deposition process produces some high momentum charged species that sputter away bottom fill. The sputtered material tends to redeposit on the sidewalls. As a result, the entry region of a high aspect ratio structure may close before bottom-up fill has been completed, leaving voids or weak spots within the structure. This phenomenon, known as "pinch-off," is exacerbated in narrow features. Limitations due to overhang formation become even more severe as the width of the gap to be filled decreases and the aspect ratio increases.

SUMMARY

Methods and apparatus for filling gaps on a partially manufactured semiconductor substrate with dielectric material using flowable deposition chemistries are provided. The methods involve rapid introduction of a process gas, e.g., a silicon-containing precursor, into a deposition chamber containing a stabilized concentration of another process gas, e.g., an oxidant. The silicon-containing precursor and oxidant react to deposit a flowable film in the gaps. According to various embodiments, the methods minimize process sensitivities of time-specific parameters, such as concentration, partial pressure, pH and reactant molar ratio, and provide control over delivery rate and temporal shape of the delivery front. Also according to various embodiments, one or more of a silicon-containing precursor, an oxidant, a catalyst, an inhibitor, a buffer, a solvent or other process gas may be introduced in rapid-delivery dose or "puff" mode.

In certain embodiments, the methods include introducing a first process gas into the chamber. The concentration of this gas in the chamber may be stabilized at a steady-state flow rate before introducing another (second) process gas. The methods may also include accumulating a second process gas in a separate chamber, such as accumulator, at a pressure that is substantially higher than the pressure in the processing chamber. The second process gas is then rapidly introduced into the processing chamber. An excess amount of the second process gas may be allowed in the chamber while it is being introduced. In certain embodiments, the excess amount is at least about 101% based on the partial pressures of the two process gases. This rapid introduction or "puffing" allows a target concentration ratio of the process gases to be reached in minimal time. The methods proceed with forming a flowable silicon-containing film on a surface of the substrate to at least partially fill the gaps and, in certain embodiments, converting the flowable film into the dielectric material. In certain embodiments, the methods further include converting the flowable silicon-containing film into the dielectric material.

In certain embodiments, a target partial pressure ratio of the second process gas to the first process gas is reached in less than about 1.0 seconds or, in more specific embodiments, in less about 0.5 seconds, less than about 0.1 seconds, or even less than about 0.05 seconds. To reach the target partial pressure ratio in a minimal time period, a high flow rate of the second process gas may be provided into the chamber. For example, the accumulator pressure level may be at least about two times greater than the processing chamber pressure level.

In certain embodiments, the first process gas may be ozone, hydrogen peroxide, oxygen, water, methanol, ethanol, and isoproponal. The first process gas may adsorb on the substrate surface during the introduction operation. In the same or other embodiments, the second process gas may be a silicon containing precursor. Examples include tetramethylcyclotetrasiloxance (TOMCTS), octamethylcyclotetrasiloxance (OMCTS), tetraethyl orthosilicate (TEOS), triethoxysilane (TES), trimethoxysilane (TriMOS), trimethoxymethylsilane, methyltriethoxysilane (MTEOS), tetramethylorthosilicate (TMOS), methyltrimethoxysilane (MTMOS), dimethyldimethoxysilane (DMDMOS), diethoxysilane (DES), triphenylethoxysilane, 1-(triethoxysilyl)-2-(diethoxymethylsilyl)ethane, and tri-t-butoxylsilanol. In other embodiments, the second process gas is a catalyst, such as a base catalyst, an acid catalyst, an inhibitor, a buffer, and a solvent. Examples include fluorides, chlorides, bromides, alkoxychlorosilanes, alkoxyfluorosilanes, hydrochloric acid (HCl), hydrofluoric acid (HF), acetic acid, trifluoroacetic acid, formic acid, dichlorosilane, trichlorosilane, methyltrichlorosilane, ethyltrichlorosilane, trimethoxychlorosilane, triethoxychlorosilane, ammonia hydroxide ($NH_4OH$), ammonium acetate ($CH_3COONH_4$), ammonia ($NH_3$), tetramethyl ammonium (($CH_3$)$_4$NOH), tetramethyl ammonium acetate (($CH_3$)$_4$NOAc), dichlorosilane ($Si_2Cl_2H_2$), trichlorosilane ($SiCl_3H$), methylchlorosilane ($SiCH_3ClH_2$), chlorotriethoxysilane, chlorotrimethoxysilane, sulphruic acid ($H_2SO_4$), phosphoric acid ($H_3PO_4$), formic acid (HCOOH), acetic acid ($CH_3COOH$), trifluoroacetic acid ($CF_3COOH$), ammonia ($NH_3$), and phosphine ($PH_3$).

In certain embodiments, the methods include accumulating a third process gas in a second accumulator, wherein the accumulator is maintained at a second accumulator pressure level and wherein the second accumulator pressure level is substantially greater than the processing chamber pressure level. The third process gas is rapidly introduced from the accumulator into the processing chamber such that a third process gas excess amount is provided in the processing chamber during the introduction of the third process gas.

Also provided are apparatus suitable for performing the methods described herein. These and other aspects of the inventions are described further below with reference to the drawings.

DETAILED DESCRIPTION OF EXAMPLE EMBODIMENTS

Figure 1:
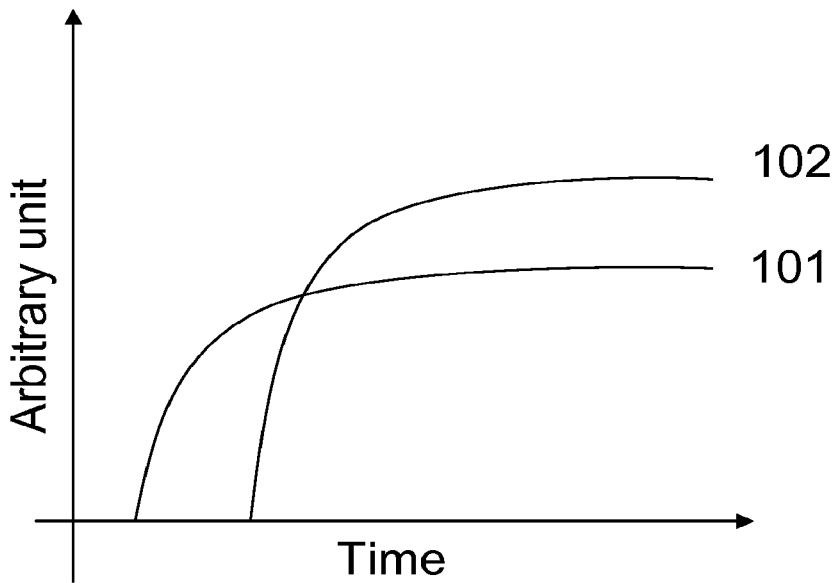
FIG. 1 shows two graphs, one graph illustrating concentration profiles of two process gases in a processing chamber as a function of time during gradual introduction of these two process gases, and one graph illustrating concentration profiles of two process gases in a processing chamber as function of time during rapid introduction or "puffing" of at least one process gas into the chamber in accordance with certain embodiments.
Figure 1:
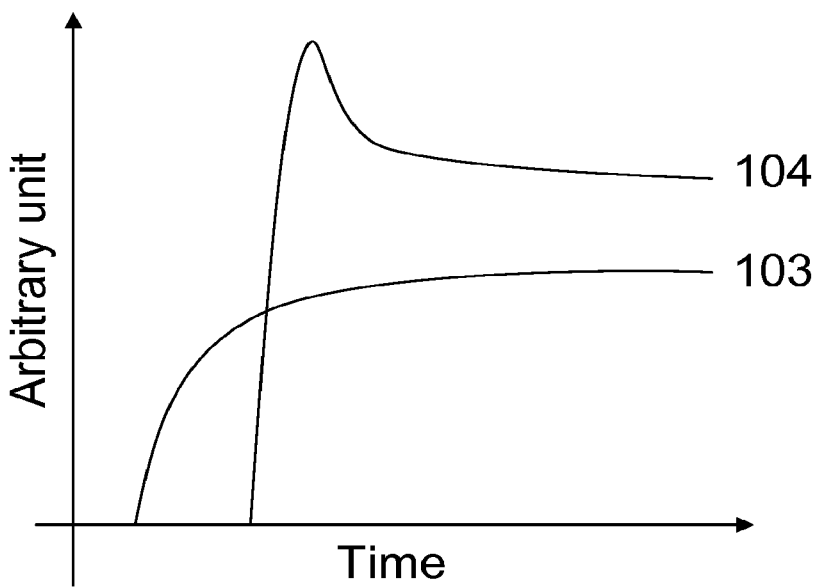

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

Introduction

Flowable oxide deposition processes are described in the context of depositing silicon oxide in narrow gaps. However, it should be understood that the described methods may be applicable to other materials and deposition processes. The flowable oxide deposition processes described herein generally involve a reaction between a silicon-containing precursor and an oxidant. The novel processes described herein may be used in accordance with various flowable oxide deposition reactions and processes.

In certain embodiments, silicon oxide deposition involves reaction of a silicon-containing precursor with an oxidant in the presence of catalysts, inhibitors, buffers and solvents, and other components that are not necessarily consumed during the deposition process. The overall deposition process may be described in context of two steps: hydrolysis and condensation. The first step involves hydrolysis of silicon-containing precursors by the oxidant. For example, alkoxy groups (—OR) of the silicon containing precursor may be replaced with hydroxyl groups (—OH). In the condensation step, Si—O—Si linkages may be formed when —OH groups are removed from Si. It should be noted that while these reaction steps provide a useful framework for describing various aspects of the invention, the methods described herein are not necessarily limited to a particular reaction mechanism.

Regardless of the particular mechanism, in certain embodiments, precise control of the reaction kinetics is provided to achieve target silicon oxide network structures. Reaction kinetics control can be achieved by adjusting pH with catalysts, inhibitors or buffers, increasing miscibility among reactants using solvents, adjusting the substrate temperature to control rates of reactions. However, because of the two-step nature of the deposition process, varying process parameters such as pH, solvent fraction, or temperature in the steady state may not yield desired film properties. For example, the optimized pH range during hydrolysis and condensation steps may be different. Therefore, it is sometimes desirable to rapidly change the acidity of the environment when the deposition reaction is transitioning from hydrolysis to condensation. This can be achieved by rapidly introducing (puffing) an acidic or basic catalyst into the reactor in the middle of the deposition process.

In some cases, where the deposition kinetics and film properties are very sensitive to the reactant ratio, it may be desirable to rapidly introduce (puff) a large amount of the silicon precursor (or an oxidant) into a stabilized flow of the oxidant (or a silicon precursor, if the oxidant is puffed) in the reactor. This allows the target reactant concentration to be reached early in the deposition process. In some other cases, where the silicon precursor and the oxidant are immiscible, a solvent may be rapidly introduced (puffed) into the reactor in large excess amounts at the beginning of the deposition process to improve the miscibility of the reaction mixture and subsequently the resulting film quality.

FIG. 1 illustrates concentration profiles of two process gases (lines 101 and 102) in a processing chamber as a function of time during a gradual introduction of both process gases into the chamber. The dashed line 101 represents a concentration profile of one gas (e.g., the first process gas), while the solid line 102 represents a concentration profile of another gas (e.g., the second process gas). In one example, the first process gas is steam and the second process gas is a silicon-containing precursor, such as trimethoxysilane (Tri- MOS) or any other precursor described below. The second gas is introduced into processing chamber at time "0", at which point the partial pressure profiles increase towards the target partial pressure levels of 100%. It should be noted that certain reaction control schemes require both rapid reaching of the target partial pressure levels, such as about 100% as shown in FIG. 1.

If the first process gas is reaction rate limiting (i.e., the rate of reaction is a stronger function of the first process gas partial pressure than on the second process gas partial pressure), then a control system may be configured in such way that the first process gas partial pressure profile (line 101) is stabilized (using a gradual ramp up) at a target level before the second process gas is introduced. A partial pressure profile of the second gas (line 102) may be different, as shown in FIG. 1, due to differences in properties of the two gases and differences in delivery systems and methods (line pressures, etc.). The time at which both process gases reach their target partial pressures together is at time "10". A time period between a point when both gases are first present in the processing chamber and a point when both gases are present at their target partial pressure is referred to as a transition period. It may be desirable to have a transition period that is as short as possible, for example, to optimize film properties such as composition or surface roughness of the deposited film.

Formation of a flowable silicon-containing film on the substrate typically occurs very rapidly, such as in 1 to 100 seconds. As mentioned above, it is desirable to have short transition time. In some process reaction conditions, when only one of the reactants is "rate limiting", the non-rate limiting reactants can be introduced into the processing chamber in excess amount without adverse effects to the deposition. In certain embodiments, the excess amount is at least about 101% of a target partial pressure ratio of the two reactants or, in more specific embodiments, at least about 110%, at least about 125%, at least about 150%, or at least about 200%. The target partial pressure ratio may be representative of a stoichiometric ratio. For example, as described in the context of FIG. 7, the rate of thin film deposition is more sensitive to the oxidant (steam in this particular case) flow than to the silicon precursor (trimethoxysilane in this case) flow, and the oxidant is therefore the rate limiting reactant.

In certain embodiments, a partial pressure of the reaction limiting process gas is stabilized in the processing chamber before introduction of other process gases that may initiate the reaction. Once the partial pressure of the reaction limiting process gas is stabilized, another process gas is rapidly introduced or puffed into the chamber. This introduction (of the second process gas) may be done in such a way that the target partial pressure of the second process gas and, as a result, the target ratio of the two gases is reached in a period of time that is substantially shorter than the reaction time. FIG. 1 also illustrates partial pressure profiles of the two process gases in the processing chamber as a function of time during rapid introduction ("puffing") of a second process gas (solid line 104) into the chamber after stabilizing the partial pressure of a first process gas (dashed line 103) in the chamber. Because the second process gas is introduced into the chamber rapidly, its partial pressure profile (solid line 104) reaches the target level by time "2". The transition phase of the embodiments illustrated by lines 101 and 102 is much shorter than that illustrated by lines 103 and 104, which may be desirable for fast reaction kinetics during deposition of flowable silicon oxide films.

As indicated above, in particular embodiments, a target level of steam is introduced and stabilized in a deposition chamber prior to the rapid introduction of a silicon-containing precursor, such as TriMOS. In other embodiments, however, other reactants, catalysts, inhibitors, buffers, solvents or other process gases may be gradually introduced and/or stabilized in the chamber prior to puffing one or more other process gases. Also in certain embodiments, steam or another oxidant may be introduced in puff mode. This is described further below with reference to Table 1.

Process

Figure 2:
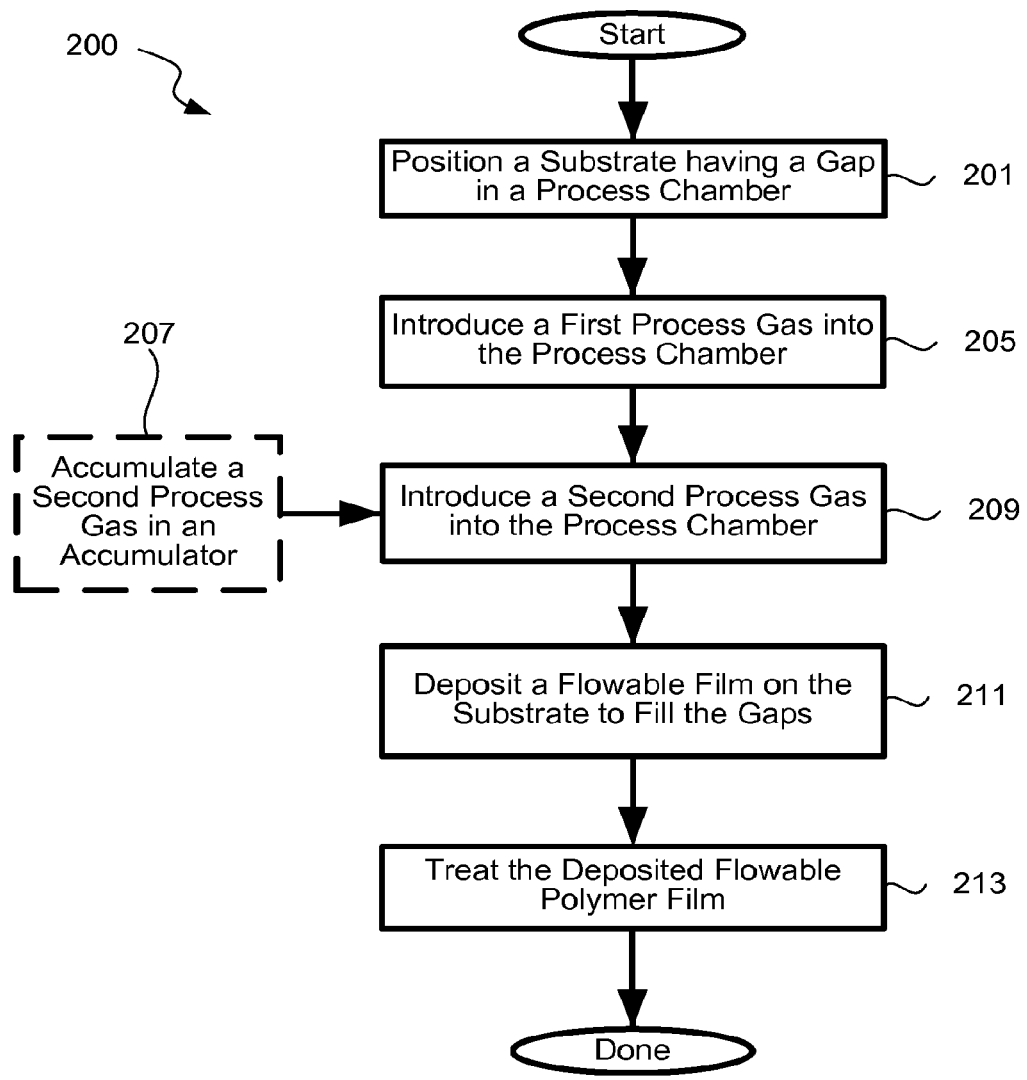
FIG. 2 is a process flow chart depicting a method of filling gaps on a partially manufactured semiconductor substrate with dielectric material in accordance with certain embodiments.

FIG. 2 is a process flow chart depicting a method 200 of filling gaps on a partially manufactured semiconductor substrate with dielectric material in accordance with certain embodiments. As shown, the method 200 may begin with positioning a substrate in the processing chamber (block 201). The substrate may be a partially manufactured semiconductor substrate with dielectric material containing one or more gaps to be filled with dielectric materials. Examples of substrate include, but not limited to, a 200-mm wafer, a 300-mm wafer, a 450-mm wafer, and any other suitable substrates. The substrate material may comprise silicon, silicon oxide, silicon nitride or other semiconductor materials. Gaps to be filled may correspond to the circuit line widths of less than about 150 nanometers or, more specifically, less than about 80 nanometers or less than about 40 nanometers.

Positioning operation 201 may involve clamping the substrate to a pedestal or other support in the processing chamber. For this purpose, an electrostatic or mechanical chuck may be employed. Operation 201 may also involve heating or cooling the substrate to a predetermined temperature level. In certain embodiments, the level is between about −50° C. to +50° C. or, more specifically, between about −15° C. and +5° C. The pedestal or any other substrate support may be equipped with a heating/cooling system to control the temperature of the substrate. Further, temperature sensors may be used to monitor the temperature of the substrate. Additional details of these devices are described below in the context of FIG. 4.

After the substrate is positioned in the processing chamber, a first process gas is introduced into the chamber in an operation 205. In certain embodiments, the first processing gas includes one or more oxidants. Examples of suitable oxidants include, but are not limited to, ozone, hydrogen peroxide, oxygen, water (steam), and alcohols, such as methanol, ethanol, and isopropanol. In certain embodiments, a remote plasma generator may supply activated oxidant species. In other embodiments, the first processing gas includes one or more silicon containing precursors. Examples include, but are not limited to, alkoxysilanes, e.g., tetraoxymethylcyclotetrasiloxane (TOMCTS), octamethylcyclotetrasiloxane (OMCTS), tetraethoxysilane (TEOS), triethoxysilane (TES), trimethoxysilane (TriMOS), methyltriethoxyorthosilicate (MTEOS), tetramethylorthosilicate (TMOS), methyltrimethoxysilane (MTMOS), dimethyldimethoxysilane (DM-DMOS), diethoxysilane (DES), dimethoxysilane (DMOS), triphenylethoxysilane, 1-(triethoxysilyl)-2-(diethoxymethylsilyl)ethane, tri-t-butoxylsilanol.

The first process gas may also include one or more dopant precursors, catalysts, inhibitors, buffers, solvents and other compounds. halogen-containing compounds, acids, or and bases. Halogen-containing compounds which may be used include halogenated organic molecule such as dichlorosilane ($Si_2Cl_2H_2$), trichlorosilane ($SiCl_3H$), methylchlorosilane ($SiCH_3ClH_2$), chlorotriethoxysilane, and chlorotrimethoxysilane. Acids which may be used may be mineral acids such as hydrochloric acid (HCl), sulphruic acid ($H_2SO_4$), and phosphoric acid ($H_3PO_4$); organic acids such as formic acid (HCOOH), acetic acid ($CH_3COOH$), and trifluoroacetic acid ($CF_3COOH$). Bases which may be used include ammonia ($NH_3$) or ammonium hydroxide ($NH_4OH$), phosphine (PH3);

and other nitrogen- or phosphorus-containing organic compounds. In some embodiments, a acidic compound may be introduced into the reactor to catalyze the hydrolysis reaction at the beginning of the deposition process, then a basic compound may be introduced near the end of the hydrolysis step to inhibit the hydrolysis reaction and the catalyze the condensation reaction. Acids or bases may be introduced by puffing to catalyze or inhibit hydrolysis or condensation reaction quickly during the deposition process. Adjusting the and altering the pH by puffing may occur at any time during the deposition process, and difference process timing and sequence may result in different films with properties desirable for different applications. Examples of other catalysts include hydrochloric acid (HCl), hydrofluoric acid (HF), acetic acid, trifluoroacetic acid, formic acid, dichlorosilane, trichlorosilane, methyltrichlorosilane, ethyltrichlorosilane, trimethoxychlorosilane, and triethoxychlorosilane Examples of solvents that may be introduced include alcohols, e.g., isopropyl alcohol, ethanol and methanol, or other compounds, such as ethers, carbonyls, nitriles, miscible with the reactants. Solvents are optional and in certain embodiments may be introduced separately or with the oxidant or another process gas. Examples of solvents include, but not limited to, methanol, ethanol, isopropanol, acetone, diethylether, acetonitrile, dimethylformamide, and dimethyl sulfoxide. In some embodiments, the solvent may be introduced by puffing it into the reactor to promote hydrolysis, especially in cases where the precursor and the oxidant have low miscibility.

Sometimes, though not necessarily, an inert carrier gas is present. For example, nitrogen, helium, and/or argon, may be introduced into the chamber with one of the compounds described above.

In certain embodiments, operation 205 involves adsorption of the first process gas molecules on the substrate surface. For example, after introducing steam into the processing chamber and reaching the target concentration/partial pressure level, the steam may reside in the chamber for a predetermined time period, such as between about 1 second and 600 seconds or, more specifically, between about 10 seconds and 120 seconds.

Figure 4:
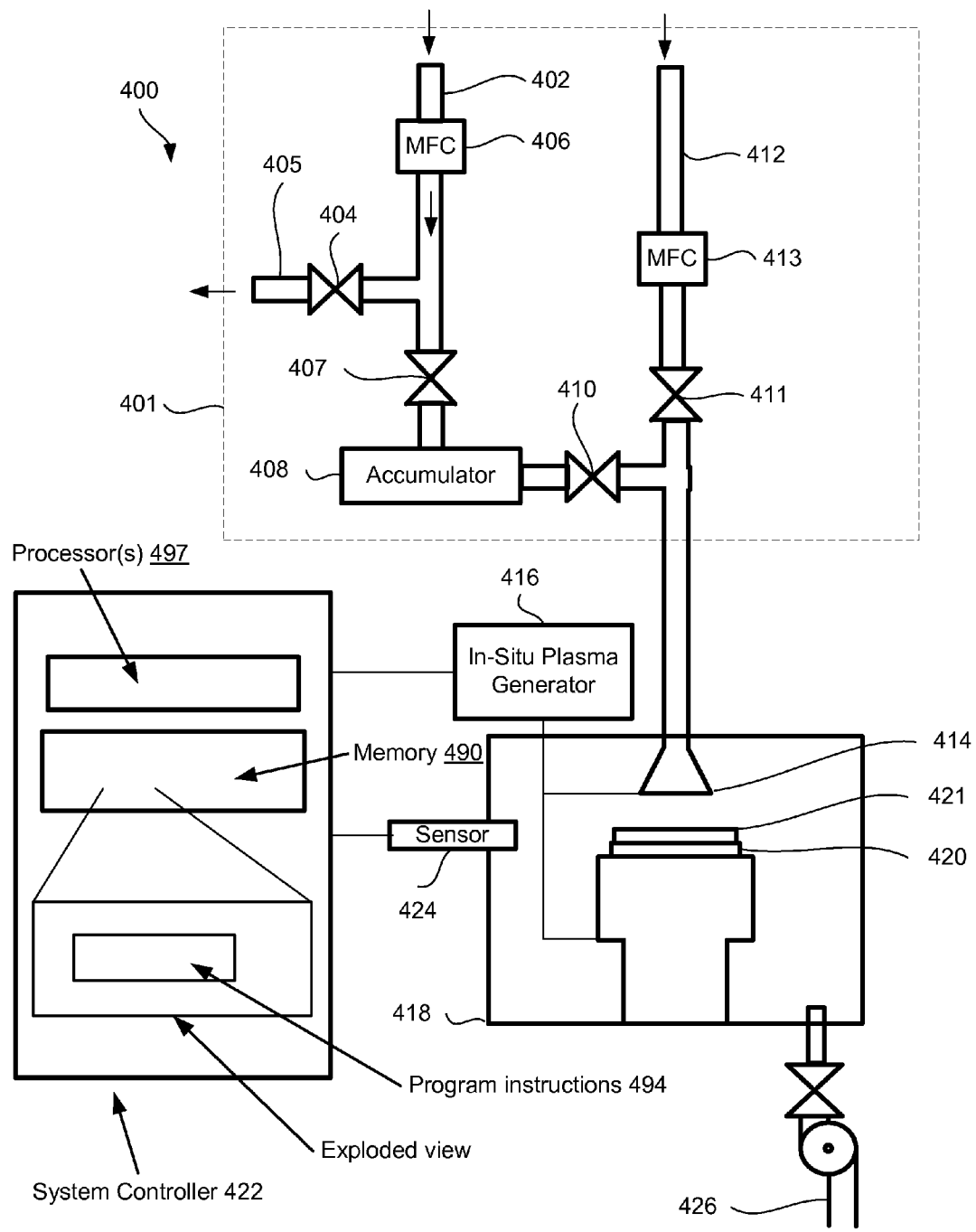
FIG. 4 shows an example of an apparatus for filling gaps on a partially manufactured semiconductor substrate with dielectric material in accordance with certain embodiments.

Typically process gases, such as the silicon-containing compound and the oxidant, are introduced via separate inlets or are combined just prior to introduction into the chamber, which is further explained in the context of FIG. 4. They may be delivered to the chamber through a showerhead, a dual-plenum showerhead, baffle plate, gas ring, injection tubes, or other means. Showerhead (or other gas inlet) to pedestal distance should be small to facilitate deposition. Showerhead-pedestal distance typically ranges from about 0.1 inches to 5 inches or, in more specific embodiments, between about 0.2 inches and 3 inches.

In some embodiments, the process gases are delivered to the reaction chamber via liquid injection system that vaporizes the liquid for introduction to the chamber. Typical flow rates of the liquid introduced into a liquid injection system range from 0.1-5.0 mL/min. Of course, one of skill in the art will understand that optimal flow rates depend on the particular reactants, desired deposition rate, reaction rate and other process conditions.

The method 200 involves an accumulation operation 207 during which the second process gas is introduced into the accumulator. This operation may be performed in parallel to first process gas introduction operation 205. Accumulation operation 207 is typically performed until a certain predetermined level in the accumulator is reached; the level may be one or more of time, pressure or molecular dose. In certain embodiments, the accumulator pressure is substantially higher than that in the processing chamber and the difference in the accumulator pressure minus the chamber pressure is referred to as the "accumulator pressure delta." For example, an accumulator pressure may be at least about 100% or, more specifically, at least about 150%, 200%, 250%, 300%, 400%, 500% or even at least about 1000% higher than the pressure of the processing chamber. Such pressure differential allows rapid introduction ("puffing") of the second process gas into the chamber in operation 209. In certain embodiments, the accumulation operation continues until the accumulator pressure delta reaches at least about 25 Torr or, in more specific embodiments, at least about 100 Torr or even 500 Torr. This accumulator pressure delta level generally depends on a composition, partial pressure, vapor pressure of the second process gas, supply of inert gases together with the second process gas, pressure inside the chamber, a ratio of the chamber volume to the accumulator volume, desired chemical reactions and other factors. In certain embodiments, the second process gas may include an inert gas in addition to a reactive entity. For example, steam may be accumulated in operation 207 together with helium. In other embodiments, the second process gas may include a catalyst, inhibitor, buffer, or solvent. For example, a silicon containing precursor may be accumulated together with a catalyst.

In certain embodiments, method 200 does not involve accumulation operation 207. Instead, the second process gas may be introduced in operation 209 directly from a delivery line maintained at high pressure levels sufficient to provide rapid introduction or puffing of the second gas into the chamber in a manner similar to the accumulator.

The second process gas may be any one or more of the compounds described above in the context of operation 205. For example, if the first process gas introduced into the chamber is steam, the second process gas may be a silicon containing precursors, such as TriMOS. Different combinations of the process gas sequences are presented in Table 1 below.

If an inert gas is used as a carrier gas for the accumulated gas, it may be mixed with that process gas prior to, in, or after that gas is accumulated in the accumulator. In certain embodiments, either the first or second process gas may consist essentially of any of an oxidant, a silicon-containing precursor, a catalyst or solvent, either with a carrier gas or alone. A catalyst may also be mixed or introduced with an oxidant, silicon-containing precursor, or solvent. A solvent may be introduced with an oxidant or silicon-containing precursor. In one example, a solvent is introduced with an oxidant prior to puffing. It may be mixed with the silicon-containing precursor prior to introduction to the deposition chamber.

After the second process gas is accumulated in operation 207, the second process gas is rapidly introduced or puffed into the processing chamber in an operation 209. This operation may involve opening a valve between the accumulator and the processing chamber and allowing the second process gas to flow into the chamber due to the pressure differential described above. The valve can be opened for a predetermined period of time, such as between about 0.1 seconds to 600 seconds. The valve may stay open to delivery a steady-state flow after the accumulated "puff" has been delivered. In certain embodiments, the second process gas may be continuously supplied into the accumulator while, at the same time, it is being discharged from the accumulator into the processing chamber. In other embodiments, operation 207 is stopped before operation 209 is initiated. These and other embodiments are described below in more details in the context of FIGS. 3 and 5A-5D as well as Table 1.

When two process gases are present in the chamber, the method 200 may proceed with depositing a flowable film on the substrate to at least partially fill the gaps (block 211). Operation 211 may start immediately upon initiating operation 209, i.e., introducing a part of the second process gas into the chamber. However, because of the rapid introduction or puffing of the second process gas, the transition period is minimized even though the overlap of operations 209 and 211 may be longer.

The puffing methods described herein may be used in accordance with various flowable oxide deposition processes, including those described in the following U.S. Patents and Patent Applications, all of which are incorporated by reference herein: U.S. patent application Ser. No. 10/810,066, filed Mar. 25, 2004, now issued U.S. Pat. No. 7,074,690; U.S. patent application Ser. No. 11/447,594, filed Jun. 5, 2006, now issued U.S. Pat. No. 7,524,735; U.S. patent application Ser. No. 11/323,812, filed Dec. 29, 2005, now issued U.S. Pat. No. 7,582,555; U.S. patent application Ser. No. 11/925,514, filed Oct. 26, 2007; U.S. patent application Ser. No. 11/834,581, filed Aug. 6, 2007 and U.S. patent application Ser. No. 12/334,726, filed Dec. 15, 2008.

Briefly, in certain embodiments, conditions in the processing chamber may be such that a silicon-containing precursor and an oxidant react to form a condensed flowable film on the substrate. Formation of the film may be aided by a catalyst, e.g., as described in above-referenced U.S. patent application Ser. No. 11/925,514, filed Oct. 26, 2007. The methods described herein are not limited to a particular reaction mechanism, e.g., the reaction mechanism may involve an adsorption reaction, a hydrolysis reaction, a condensation reaction, a polymerization reaction, a vapor-phase reaction producing a vapor-phase product that condenses, condensation of one or more of the reactants prior to reaction, or a combination of these. The substrate is exposed to the process gases for a period sufficient to deposit a flowable film to fill at some of the gaps. The deposition process typically forms soft jelly-like film with good flow characteristics, providing consistent fill. The deposited film may also be described herein for the purposes of discussion as a gel having liquid flow characteristics, a liquid film, or a flowable film. In certain embodiments, the flowable film is an organo-silicon film, e.g., an amorphous organo-silicon film.

Chamber pressure may be between about 0.1 Torr and 100 Torr, in certain embodiments, it is between about 1 Torr and 50 Torr. Lower pressures typically result in slower deposition rates. Substrate temperature is typically between about $-20°$ C. and $+100°$ C. or, in more specific embodiments, between about $-15°$ C. and $+5°$ C. Pressure and temperature may be varied to adjust deposition time and film properties.

Reaction time depends on reaction conditions as well as the desired film thickness. Deposition rates typically range from about 1 Angstroms per second to about 1,000 Angstroms per second or, in more specific embodiments, 2 Angstroms per second to about 500 Angstroms per second. In certain embodiments, a thickness of the deposited film is between about 5 Angstroms to about 5,000 Angstroms or, in more specific embodiments, between about 10 Angstroms and 1000 Angstroms or, even more specifically, between about 50 Angstroms and 500 Angstroms. The deposition thickness listed here is for a single cycle involving operation 211. It should be noted that multiple cycles can be used to build up a thickness of the overall film to a desirable level, either prior to or after converting the flowable silicon-containing film to the dielectric material. In certain embodiments, the deposited film has a refractive index of between about 1.35 and 1.50 or, in more specific embodiments, between about 1.40 and 1.45.

In certain embodiments, the flowable film deposited on the substrate contains some combination of Si—O, Si—H, and Si—OH bonds. Process conditions in certain embodiments may be such to prevent significant incorporation of organic (carbon-containing) groups in the film. For example, in reaction between TES and steam, a chemical reaction causes formation of a flowable film containing Si—OH, Si—H and Si—O bonds, while the ethoxy group is removed as a gaseous ethanol byproduct. The byproduct and/or excess reactants may be continuously purged or pumped out.

Physical properties and chemical composition of the deposited film depend on silicon precursors, oxidants, catalysts, solvents, and other materials used in the deposition process. For example, an alkoxyl silane compound containing Si—H bond may result in a film also containing Si—H bond, but little or no Si—OH or C—H bonds. In other cases, an alkoxyl silane compound containing only alkoxyl groups may result in a film containing more Si—OH bonds but little or no Si—H bonds.

Optional substrate pre- and post-deposition treatments may be performed. Substrate pre-deposition treatments may be performed to wet the surface, e.g., by exposing the substrate to steam. Certain examples of pre-deposition treatments are described above. Substrate post-deposition treatments may be performed to induce further cross-linking of Si—O bonds, e.g., by exposing the substrate to steam or other stronger oxidant such as mono-, di-, or tri-oxygen (block 213).

A portion or all of the film deposited in operation 211 may be densified in operation 213 by, for example, a cure/anneal process, as described in U.S. patent application Ser. No. 11/925,514, filed Oct. 26, 2007; U.S. patent application Ser. No. 11/834,581, filed on Aug. 6, 2007; and U.S. patent application Ser. No. 12/334,726, filed on Dec. 15, 2008, which are incorporated herein in their entirety for the purposes of describing densification of the deposited film. According to various embodiments, this involves a steam, thermal, ultraviolet (UV), electron-beam (E-beam), microwave, laser or plasma anneal in oxidative or inert environment. In certain embodiments, the film in operation 211 is deposited at or less than the predetermined thickness so that the anneal process uniformly densifies this portion of the film without creating a density gradient.

According to various embodiments, the film density may be improved to a solid oxide film by exposure to activated species from a downstream or direct plasma. Examples include, but not limited to, are oxygen, silane, hydrogen, helium, argon, and steam plasmas. Nitrogen-containing species may also be used if the incorporation of nitrogen in the resulting dielectric film is desirable. Silicon-containing species may also be used if the incorporation of additional silicon in the resulting dielectric film is desirable. Temperatures during plasma exposure are typically at least about $200°$ C. The plasma source may be, for example, radio frequency (RF) and microwave sources. In RF plasma, plasma source power is typically at least about 500 W. The plasma source may be an inductively-coupled plasma or a capacitively-coupled plasma. Also the plasma-assisted conversion may be performed with a bias power applied to the substrate.

In some embodiments, a thermal anneal may be used instead of or in addition to plasma species to convert the deposited film into a solid oxide. Thermal annealing may be performed in any suitable environment, such as a steam, oxygen, air, carbon dioxide, hydrogen, nitrogen, silane, or inert environment. In specific embodiments, it is desirable to conduct the thermal anneal in an oxidizing ambient to facilitate conversion of the Si—OH and Si—H bonds into Si—O bonds. Temperatures are typically at least about 250° C. in order to break Si—OH bonds. For example, thermal anneal of a silanol gel results in formation of a solid silicon dioxide film and release of water vapor as a by-product.

In one example, a steam pre-treatment is performed, with steam introduced with an alcohol solvent into the chamber and stabilized at a steam partial pressure of between about 0.5 Torr and 30 Torr, or more particularly, between about 1 Torr and 10 Torr. Prior to, during or after steam introduction, wafer temperature is stabilized between about −15° C. and +5° C., e.g., about −5° C. This steam pre-treatment may be performed, in certain embodiments, for about 10 minutes or less, in certain embodiments, for about 60 seconds or less, e.g., about 10 seconds or about 1 second. During at least part of the steam pre-treatment, a silicon-containing precursor may be accumulated to reach an accumulator pressure of between about 50 Torr and 1000 Torr. Once the steam partial pressure is stabilized and the necessary pressure is reached in the accumulator, the silicon-containing precursor is rapidly introduced or puffed into the processing chamber, where the reaction takes places. Byproducts are continuously purged or pumped out. A plasma or thermal anneal at least about 275° C. is then performed.

In certain embodiments (not shown in FIG. 2), the method 200 may include subsequent introduction of other process gases into the chamber during one of the operations described above, i.e., introduction of the second process gas in operation 209 or depositing a flowable film in operation 211. Some of these gases may be introduced rapidly or puffed similar to the second process gas described above.

Figure 3:
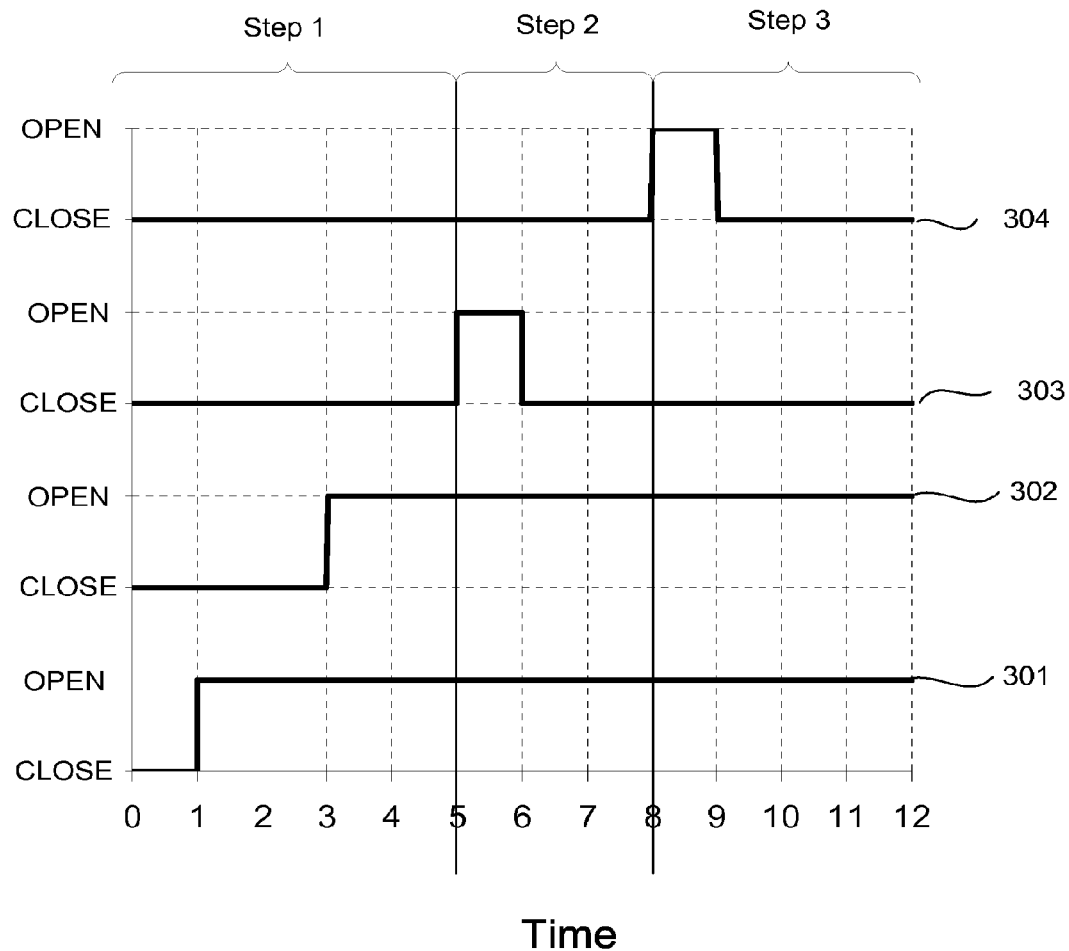
FIG. 3 is an example of a general valve/MFC position diagram corresponding to the introduction of multiple process gases into the chamber in accordance with certain embodiments.
Figure 5A:
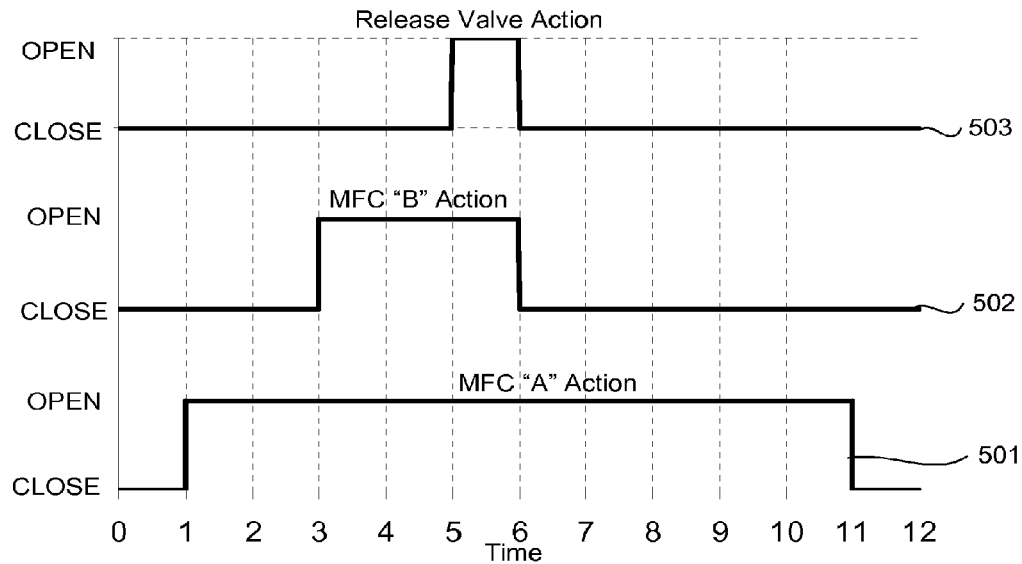
FIG. 5A illustrates one example of a valve/MFC position sequence for a process that includes a process gas accumulation operation in accordance with certain embodiments.
Figure 5B:
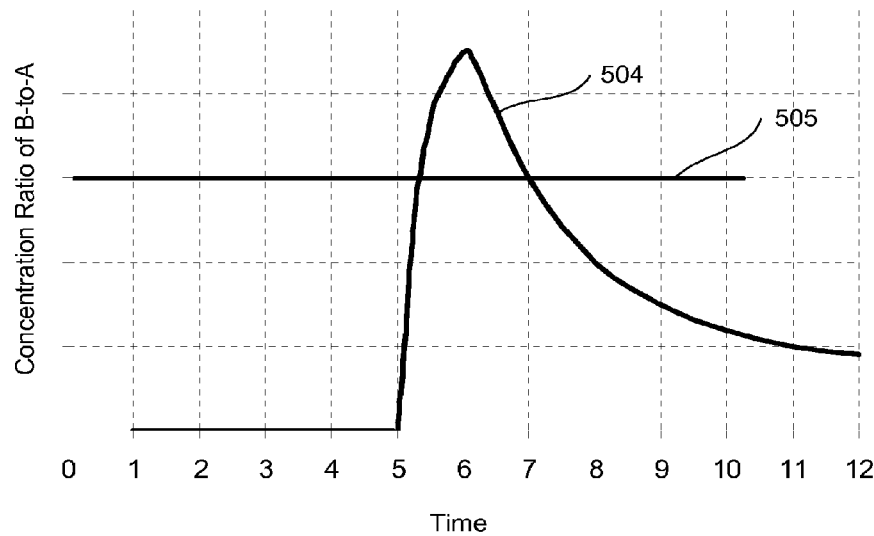
FIG. 5B illustrates an example profile of reactant concentration ratios in the processing chamber corresponding to the sequence shown in FIG. 5A in accordance with certain embodiments.
Figure 5C:
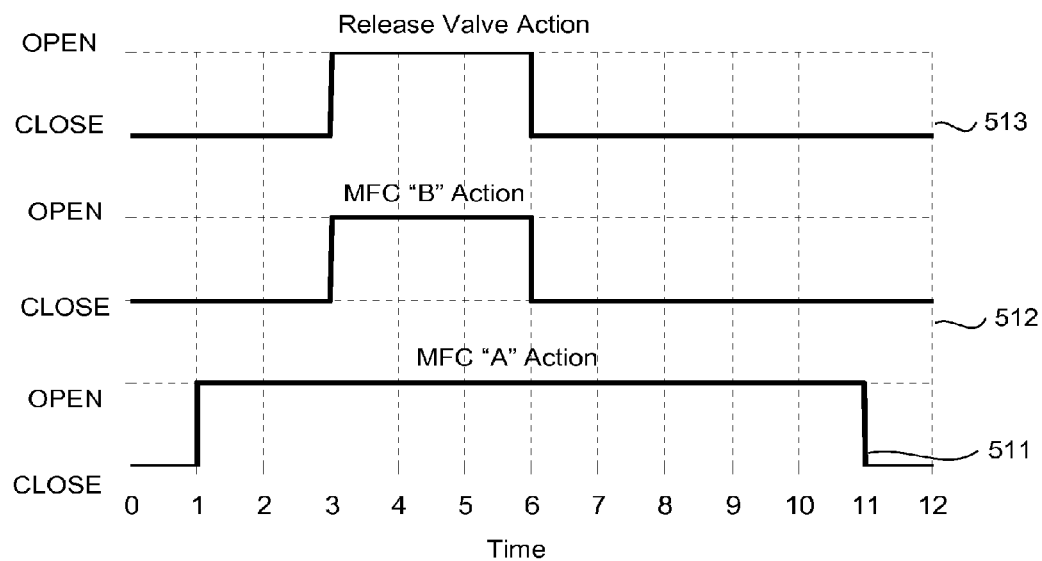
FIG. 5C illustrates another example of a valve/MFC position sequence for a process that does not include a process gas accumulation operation in accordance with certain embodiments.

FIG. 3 is an example of a general valve/MFC position diagram corresponding to introduction of multiple process gases into the chamber in accordance with certain embodiments. For example, an oxidizing agent, such as steam, may be first introduced into the chamber during the pre-treatment step (Step 1). A valve/MFC controlling the oxidizing agent may be opened at time "1" (line 301). The vertical axis of FIG. 3 as well as that of FIGS. 5A and 5C are labeled with "OPEN" and "CLOSE" designations, which represent respective actions performed on valves/MFCs. It should be understood that these actions may be performed to introduce process gases into the processing chamber at certain flow rates and that the flow rates may be variable during the introduction process. Further, it should be understood that "OPEN" and "CLOSE" may be representative of the actions to provide more flow ("OPEN") or less flow ("CLOSE") into the chamber. A valve may not necessarily have to be in a completely closed position (i.e., not allowing any process gas into the chamber) before performing an action corresponding to "OPEN". For example, a valve/MFC may be partially opened and an "OPEN" action is performed to provide higher flow rate of the corresponding process gas into the chamber.

After partial pressure of the oxidizing agent is stabilized in the chamber and, in certain embodiments, some of it is allowed to adsorb on the substrate surface, a silicon containing precursor may be gradually introduced or rapidly introduced ("puffed") into the chamber at time "3". This is done by opening a corresponding valve/MFC (line 302). It should be noted that in the embodiments where the silicon containing precursor is puffed, an accumulation operation as described in the context of FIG. 2 (and not shown in FIG. 3) may precede the opening of the valve (line 302). Further, in some embodiments, a silicon containing precursor may be introduced gradually, for example, when the reaction kinetics is controlled by subsequent introduction of the catalysts, solvents, inhibitors, and/or other components.

The process may proceed into step 2, the deposition step, which may be initiated by rapid introduction or puffing of a silicon containing precursor as described above or of an acid catalyst into the chamber by opening a corresponding valve/MFC (line 303). This may catalyze and increase the reaction rate between the silicon containing precursor and the oxidizing agent as mentioned above. An accumulation operation as described in the context of FIG. 2 may precede the opening of the valve (line 303). In the certain embodiments, the process may proceed into the next step (Step 3), by "puffing" another process gas 304 into the chamber. The process gas 304 may be a base catalyst, inhibitor, buffer or a solvent described above.

Table 1 below summarizes various examples of introduction sequences of different process gases. Gases that are puffed are marked with asterisk (*), with gases that are introduced gradually unmarked.

TABLE 1

| Example | First Pr. Gas | Second Pr. Gas | Third Pr. Gas | Fourth Pr. Gas |
|---|---|---|---|---|
| 1 | Steam | Si Precursor* | — | — |
| 2 | Steam | Si Precursor | Acid Catalyst* | Base Catalyst* |
| 3 | Steam | Si Precursor | Acid Catalyst* | Buffer* |
| 4 | Si Precursor | Steam* | — | — |
| 5 | Si Precursor | Steam* | Acid Catalyst* | — |
| 6 | Si Precursor | Steam* | Acid Catalyst* | Base Catalyst* |
| 7 | Solvent | Steam* | Si Precursor* | Catalyst* |

In certain embodiments, any combination of operations 201-213 may be repeated (not shown in the diagram). For examples, operations 201-211 may be repeated before proceeding to operation 213. In another example, operations 205-213 may be repeated in the same chamber. In certain embodiments, the process gases may consist essentially of the gases listed in any row of Table 1.

Apparatus

The methods described above may be performed on a wide-range of processing apparatuses chambers. The methods may be implemented on any apparatuses equipped for deposition of dielectric film, including HDP-CVD reactors, PECVD reactors, SACVD reactors, ALD or iALD chambers, any chamber equipped for CVD reactions, and apparatuses used for oxide PDL (pulsed deposition layers).

Such an apparatus may take many different forms. Generally, the apparatus will include one or more processing chambers or "reactors" (sometimes including multiple stations) that house one or more substrates and that are suitable for substrate processing. Each chamber may house one or more substrate for processing. The one or more chambers maintain each substrate in a defined position or positions (with or without motion within that position, e.g. rotation or vertical translation). While in process, each substrate is supported and, optionally, clamped by a pedestal, electrostatic chuck, mechanical chuck, and/or other wafer holding apparatus. For certain operations, in which the wafer may be heated or cooled, the apparatus may include a temperature control plate including a heater or chiller.

In certain embodiments, the present invention may be implemented in a HDP CVD reactor. An example of a suitable reactor is the Speed™ reactor, available from Novellus Systems Inc. of San Jose, Calif. In certain embodiments, the present invention may be implemented in a PECVD reactor. Examples of suitable reactors are the Sequel™ reactor and the Vector™ reactor, both available from Novellus Systems Inc. of San Jose, Calif. In certain embodiments, the present invention may be implemented in a CVD chamber equipped for metal and/or dielectric deposition. An example of a suitable reactor is the Altus™ reactor available from Novellus Systems of San Jose, Calif. In certain embodiments, the present invention may be implemented in a chamber equipped for atomic layer deposition (ALD), pulsed deposition layer (PDL), or pulsed nucleation layer (PNL) depositions. Examples of such reactors are the Altus DirectFill™ reactor, the iALD™ reactor, and the PDL Oxide reactor, both available from Novellus Systems Inc. of San Jose, Calif.

In certain embodiments, the deposition and conversion operations are performed in the same reaction chamber. In other embodiments, the deposition and conversion operations are performed on different stations in the same reaction chamber. In other embodiments, the deposition may be performed in a first chamber and then transferred to a second chamber for a thermal, plasma or other type of conversion or anneal. For example, reactors that are configured for plasma reactions may be used for both the deposition and plasma anneal operations. Other reactors may be used for both the deposition and thermal anneal operations.

FIG. 4 shows an example of an apparatus 400 for filling gaps on a partially manufactured semiconductor substrate with dielectric material in accordance with certain embodiments of the invention. The apparatus 400 may be suitable for both the deposition of a flowable film and post-deposition treatment described above. As shown, the apparatus 400 includes a processing chamber 418, which encloses other components of the apparatus 400 and, in certain embodiments, serves to contain the plasma. The chamber 418 contains a showerhead, gas ring, gas injector or other delivery hardware (generally shown as 414), a substrate pedestal 420, and sensors 424. An optional in-situ plasma generator 416, such as low-frequency RF generator and/or a high-frequency RF generator, may be connected to the showerhead 414 or pedestal 420. The power and frequency are sufficient to generate a plasma from the process gas, for example, 400-8000 W total energy for a deposition, and a higher power for a plasma anneal. In certain embodiments, the generators are not used during the deposition, e.g., the deposition takes place in "dark" or non-plasma conditions. During the plasma anneal step, one or more HF, MF and LF generators may be used. For example, in a typical process, the high frequency RF component is generally between 2-60 MHz; in a preferred embodiment, the component is 13.56 MHz.

Within the processing chamber 418, the pedestal 420 supports a substrate 421. The pedestal 420 typically includes a chuck, and lift pins to raise and lower the substrate 421 during and between the deposition and/or plasma treatment reactions. The chuck may be an electrostatic chuck, a mechanical chuck, a vacuum chuck or various other types of chuck as are available for use in the industry and/or research.

The process gases are introduced into the chamber 418 through the delivery hardware 414 and a delivery system 401 connected to the delivery hardware 414. The delivery system 401 includes multiple lines, accumulators, valves, mass flow controllers, liquid flow controllers, vaporizers, flow meters, pressure sensors, thermocouples, inlets, and outlets that are collectively configured to introduce process gases into the chamber 418 using gradual and rapid ("puffed") introduction modes. The delivery system 401 illustrated in FIG. 4 includes two inlets 402 and 412 and two outlets 405 and 414, one of which is delivery hardware 414. It should be noted that any number of inlets and outlets could be used in the system. The inlets may be connected to divert lines carrying corresponding process gases at predetermined pressure or flow levels or may be connected directly to pressure regulators of storage tanks containing the process gases. Certain gases may be premixed and delivered into the system as mixtures. Each inlet is typically associated with a specific process gas (or a specific mixture) and has a designated set of valves (could be one or more). This combination of elements for each process gas or mixture is sometimes referred to as a delivery line.

In certain embodiments, delivery lines of the system 401 and delivery hardware 414 are heated to between about 60° C. and 150° C. or more specifically to between about 85° C. and 110° C. These temperatures may be determined by compositions, pressure, and other characteristics of the delivered gases. For example, one or more process chemicals (precursors, solvents, catalysts) may be introduced into the delivery system 401 in a liquid form. These liquids are then evaporated and mixed with other inert or reactive process gases in various components of the delivery system, such as a manifold, heated above its evaporation point before reaching the deposition chamber.

As described above, processes gases may be introduced into the chamber 418 gradually or rapidly ("puffed"). Devices of the delivery system 410 that are used for gradual introduction may include an inlet line 412 connected to a process gas source (not shown), a mass flow controller (MFC) 413, and a outlet valve 411. The MFC 413 may be adjusted to provide a predetermined flow rate level into the chamber 418. For example, a steady-state flow rate of the silicon containing precursor may be between about 10 sccm and 600 sccm. A steady-state flow rate of the oxidizing agent may be between about 10 sccm and 600 sccm. A steady-state flow rate of inert gas may be between about 500 sccm and 8,000 sccm. A steady-state flow rate of the solvent may be between about 0 sccm and 1000 sccm. In the case of rapid ("puffed") delivery, the initial rapid flow rates may be an order of magnitude higher than steady-state flow rates. The flow rates are provided for MFC set points that are equivalent for both gradual and rapid delivery. However, in the rapid delivery mode, the pressure differential between the accumulator and chamber leads to much higher "instantaneous" flow rates that are not presented (or could be easily quantified). An MFC 413 may be set to provide a constant flow rate or a variable flow rate (e.g., a profiled flow rate). A system controller 422 may be used to control the MFC 413 and the outlet valve 411. It should be noted that the delivery system 401 may have multiple delivery lines for gradual introduction of different process gases into the chamber 418.

A delivery line for rapid introduction or puffing of a process gas into the chamber 418 in the puffed regime may include an inlet 402, a mass flow controller (MFC) 406, a divert valve 404 and a divert line 405, an accumulator inlet valve 407, an accumulator 408, and a release valve 410. During an accumulation operation (such as operation 207 in FIG. 2), the MFC 406 is given a set point, while the accumulator inlet valve 407 is open and the release valve 410 is closed. The accumulator is filled to a pre-determined time, pressure, or dose. The process gas is introduced into the accumulator 408 when, for example, it reaches a certain predetermined time, pressure or dose amount. A volume of the accumulator relative to the volume of the processing chamber may be between about 1% to 0.001% or, more specifically, between about 0.1% to 0.01%. Once a predetermined amount of the process gas is provided in the accumulator 408 (determined by the pressure, time or any other process parameters), the accumulator inlet valve 407 may be closed and the process gas from the inlet 402 may be diverted through the divert valve 404 into the divert line 405. Alternatively, the accumulator inlet valve 407 may remain open during introduction of the process gas from the accumulator 408 into the processing chamber 418. Finally, during introduction of the process gas into the chamber 418, the release valve 410 is rapidly opened and the process gas flows from the accumulator 408 into the chamber 418 due to the pressure differential. The accumulator inlet valve 407 and release valve 410 may remain open to delivery steady-state flow after the puff has been delivered.

Valves and MFCs of the delivery system 401 can be controlled, for example, by a system controller 422 in such a way that desirable ratios of the process gases' concentrations or partial pressures are achieved in the process chamber within targeted time periods. Examples of valve/MFC opening/closing sequences and respective concentration ratios inside the chamber are presented in FIGS. 5A-5D. For example, FIG. 5A illustrates an exemplary gas delivery sequence for process gases "A" and "B". Process gas "A" is delivered using a line with an inlet valve, outlet valve and an MFC or other liquid/vapor delivery unit—"A" (similar to inlet 412 and MFC 413, respectively, in FIG. 4). Process gas "B" is delivered using another line with an accumulator inlet valve, MFC or other liquid/vapor delivery unit—"B", accumulator, and a outlet valve (similar to inlet 402, MFC 406, accumulator 408, and release valve 410, respectively, in FIG. 4). Process gas "A" is introduced into the chamber at time 1 by opening its outlet valve. Line 501 represents respective actions performed on the outlet valve "A". FIG. 5B illustrates a corresponding partial pressure profile (line 504) of process gas "B" inside the processing chamber as a function of time.

At time 3, the "B" accumulator inlet valve is opened to allow process gas "B" to flow into the accumulator. Line 502 represents respective actions performed on the accumulator inlet valve. However, the outlet valve, which corresponds to line 503, is kept closed at time 3. Thus, process gas "B" is introduced into the accumulator without flowing into the chamber. This accumulation continues until time 5, at which point the outlet valve is opened and process gas "B" is allowed to flow into the chamber. The accumulator inlet may be kept open during the introduction of process gas "B" into the chamber (as shown in FIG. 5A) or closed before or at the time of the introduction. The partial pressure profile of "B" (line 504 in FIG. 5B) rapidly increases during this time. In certain embodiments, the two processes gases may immediately start reacting with each other to form a flowable film on the substrate. In other embodiments, rapid introduction of the second process gas, such as process gas "B" in FIGS. 5A and 5B, does not lead to an immediate reaction between the two processes gases. Instead, the reaction may be delayed until, for example, further introduction of catalysts or solvents.

The outlet valve is shut off at time 6 (line 503) together with the accumulator inlet valve (line 502) and the partial pressure profile (line 504 in FIG. 5B) may gradually decrease. In certain embodiments, such as the one illustrated in FIG. 5A, process gas "A" is continued to be introduced (line 501) into the chamber after delivery of process gas "B" into the chamber is shut-off (e.g., at time 6 in FIG. 5A).

Line 505 represents the target partial pressure ratio of process gas "B" to "A". The target partial pressure ratio depends on desired process conditions, chemical reactions and resulting film properties. The target partial pressure ratio may range from 0.01 to 100. Because process gas "B" has been accumulated between time 3 and 5 and not introduced into the chamber until time 5 no interaction between this gas and process gas "A", which was in the chamber from time 1, can occur until time 5. Further, because of rapid introduction of process gas "B" into the chamber at time 5, the target partial pressure ratio is reached in a short period of time, such as less than half of the time period it would take with gradual introduction, as illustrated in FIG. 5B by the left-most intersection of lines 504 and 505. This short duration will now be contrasted with gradual introduction of both process gases that is illustrated in FIGS. 5C-5D.

Figure 5D:
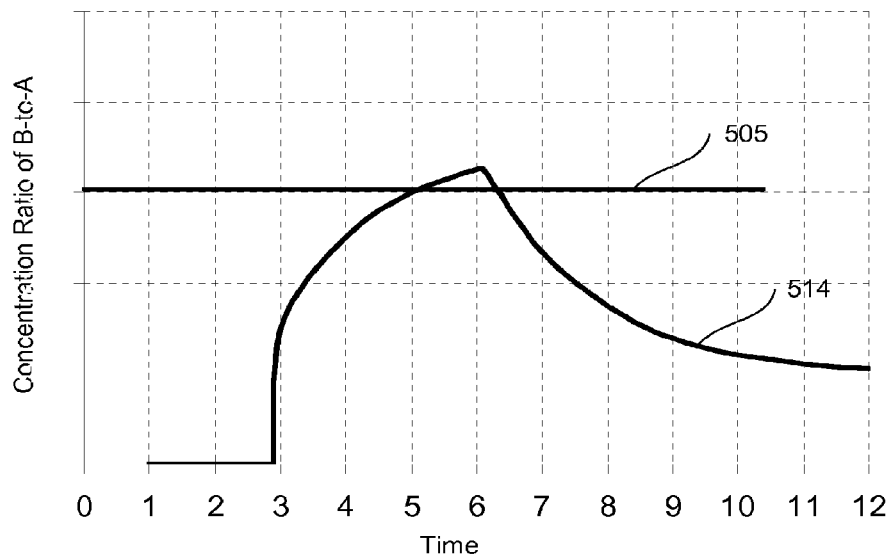
FIG. 5D illustrates an example profile of reactant concentration ratios in the processing chamber corresponding to the sequence shown in FIG. 5B in accordance with certain embodiments.

FIGS. 5C and 5D illustrate another example of valve position sequence, and a corresponding partial pressure profile in the processing chamber over time in accordance with certain embodiments. In this example, the process does not include a process gas accumulation operation. The main difference with the sequence shown in FIG. 5A is that the outlet valve (corresponding to line 513) in FIG. 5C is opened together with the accumulator inlet valve (corresponding to line 512) at time 3. As a result, process gas "B" is introduced into the chamber at this time. FIG. 5D illustrates a target partial pressure "B"-to-"A" ratio profile (line 514) inside the processing chamber as a function of time. The target partial pressure ratio (line 505) is reached around time 5, or after about two time periods from introduction of process gas B into the chamber at time 3. This duration is much longer than that shown in example corresponding to FIGS. 5A and 5B.

Returning to FIG. 4, reaction products and other gases exit the chamber 418 via an outlet 426. A vacuum pump (e.g., a one or two stage mechanical dry pump and/or a turbomolecular pump) typically draws process gases out and maintains a suitably low pressure within the processing chamber by a closed loop-controlled flow restriction device, such as a throttle valve or a pendulum valve.

The chamber 418 may include a sensor 424 for sensing various process parameters, such as chamber pressure, concentration of process gases inside the chamber, temperature, and others. The sensor 424 may provide sensed information to the system controller 422. Examples of the sensor 424 include residual gas analyzers, pressure sensors, thermocouples, infrared pyrometers, and others. The sensor 424 may also include an infra-red detector or optical detector to monitor presence of gases in the chamber and control measures.

In certain embodiments, a system controller 422 is employed to control, process parameters. The system controller 422 typically includes one or more memory devices 490 and one or more processors 497. The processor may include a CPU or computer, analog and/or digital input/output connections, stepper motor controller boards, etc. Typically there will be a user interface associated with system controller 422. The user interface may include a display screen, graphical software displays of the apparatus and/or process conditions, and user input devices such as pointing devices, keyboards, touch screens, microphones, etc. Although the system controller 422 is shown connected to plasma generator 416, its placement and connectivity may vary based on the particular implementation.

In certain embodiments, the system controller 422 controls the pressure in the processing chamber. The system controller 422 may also control concentration of various process gases in the chamber by regulating valves, liquid delivery controllers and MFCs in the delivery system 401 as well as flow restriction valves in the exhaust line 426. The system controller 422 executes system control software including sets of instructions 494 for controlling the timing, flow rates of gases and liquids, chamber pressure, substrate temperature, and other parameters of a particular process. Other computer programs stored on memory devices associated with the controller may be employed in some embodiments.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways.

For example, various chamber component subroutines or control objects may be written to control operation of the chamber components necessary to carry out the described processes. Examples of programs or sections of programs for this purpose include process gas control code, pressure control code, and plasma control code.

The controller parameters relate to process conditions such as, for example, timing of each operation, pressure inside the chamber, substrate temperature, process gas flow rates, as well as others described above. These parameters are provided to the user in the form of a recipe, and may be entered utilizing the user interface. Signals for monitoring the process may be provided by analog and/or digital input connections of the system controller 422. The signals for controlling the process are output on the analog and digital output connections of the apparatus 400.

Figure 6:
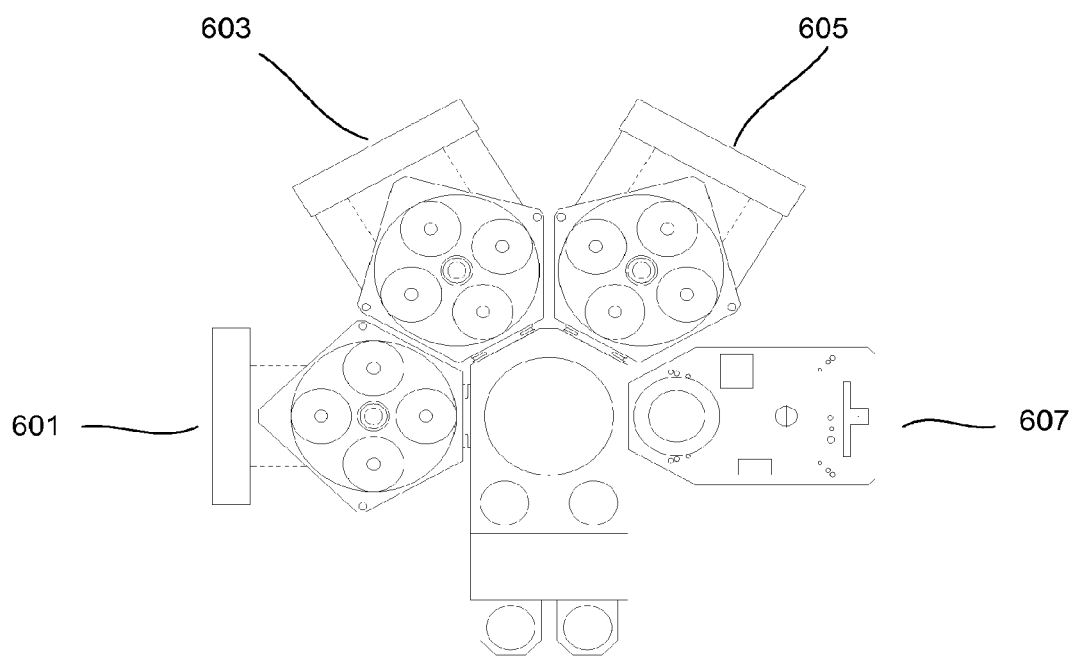
FIG. 6 illustrates an example of a multi-module apparatus having one or more modules for a flowable film deposition and, in certain embodiments, an anneal/cure module.

In certain embodiments, a multi-module apparatus having one or more modules for a flowable film deposition and anneal/cure may be used. An example of such an apparatus is shown in FIG. 6. In this example, modules 601-605 are multi-station modules for low-temperature CVD for deposition of a flowable film as described above. Module 607 may be a post-deposition treatment module that may be used for thermal, UV or plasma curing (e.g., in the anneal operations described above) as well as for other processes including plasma etch-back and cap deposition. In other embodiments, modules 601-605 may be single-station modules.

EXPERIMENTAL

Flowable films were deposited on substrates using different flow rates of steam and trimethosysiloxane (TriMOS). Films were deposited at chamber pressures of 10 to 40 Torr and pedestal temperatures of −15 to +5 degrees Celsius. Process and inert gas flow rates were in the following ranges: 100 to 500 sccm of steam, 20 to 600 sccm of TriMOS, 0 to 50 sccm of organo-chloride catalyst, 0 to 1000 sccm of alcohol (methanol, ethanol, isopropanol), and 1 to 8 slm of helium.

Figure 7:
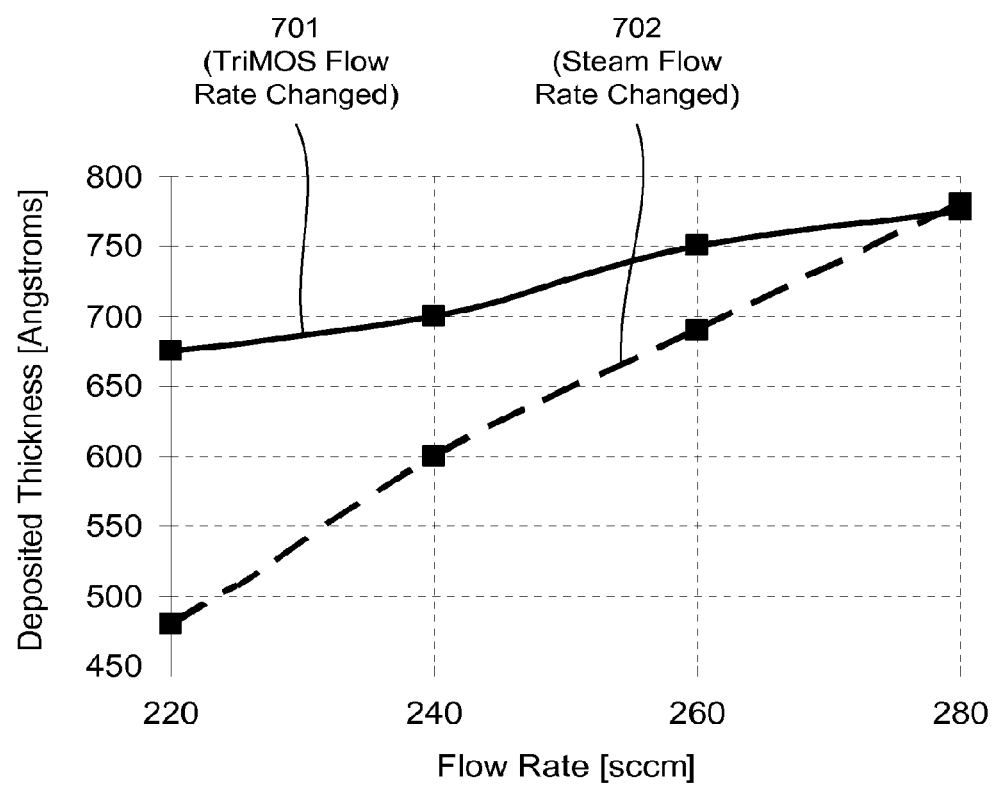
FIG. 7 illustrates deposited thicknesses of dielectric materials as functions of trimethoxysilane (TriMOS) precursor and steam flow rates.

In a first set of experiments, the flow rate of the steam was kept the same at about 280 sccm for all depositions. The TriMOS precursor flow rates were different in each of the four depositions—about 220 sccm, about 240 sccm, about 260 sccm, and about 280 sccm. FIG. 7 illustrates resulting deposition thicknesses (solid line 701) as a function of the different TriMOS precursor flow rates for these experiments.

In another set of experiments, the flow rate of the TriMOS precursor was kept the same in all experiment at about 280 sccm. Instead, the steam flow rates were different in each of the four depositions—about 220 sccm, about 240 sccm, about 260 sccm, and about 280 sccm. FIG. 7 illustrates resulting deposition thicknesses (dashed line 702) as a function of the steam flow rates for the second set of experiments. FIG. 7 reveals that line 702 is much steeper than line 701 positing that the deposition thickness was more sensitive to the changes in the steam flow rates than the TriMOS precursor flow rates. Accordingly, it was determined that steam is reaction limiting.

Figure 8:
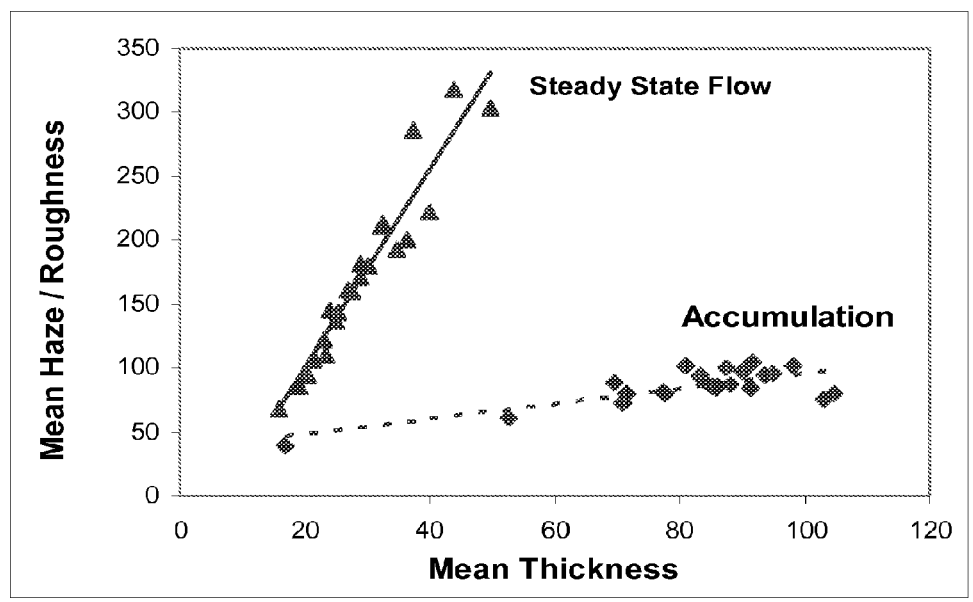
FIG. 8 illustrates haze values as a function of the film thickness for two different regimes of TriMOS introduction into a processing chamber.

Another series of experiments was conducted to compare effects of gradual and rapid introduction of the TriMOS precursor on surface roughness of the deposited film. It is generally desirable for a deposited film to have a lower surface roughness, which can be represented by optical haze values. Films having various thicknesses were deposited using gradual TriMOS introduction. Haze values as a function of film thickness for this series are illustrated as a "Constant Flow" line in FIG. 8. Another set of films having various thicknesses (roughly corresponding to the first set) was deposited using rapid TriMOS introduction (i.e., puffed mode). The resulting haze values for the second set are illustrated as an "Accumulation" line in FIG. 8. Overall, the rapid TriMOS introduction resulted in lower optical haze/surface roughness, which may be desirable in certain applications.

Figure 9:
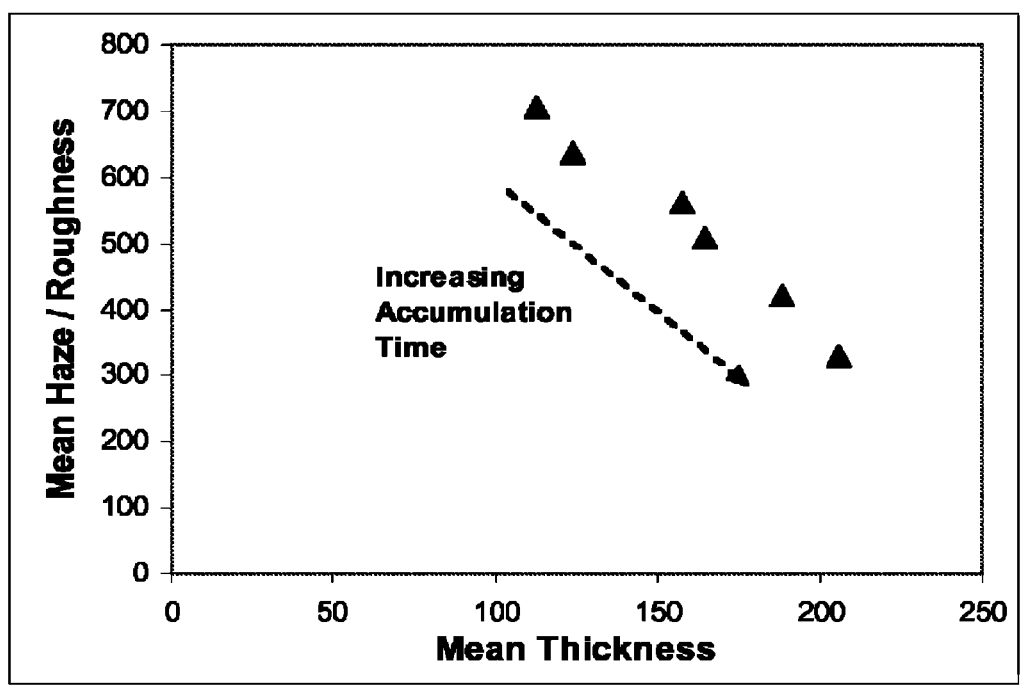
FIG. 9 illustrates haze values as a function of the deposited film thickness resulting from different accumulation durations of a TriMOS precursor.

In yet another series of experiments, effects of accumulation time on roughness/haze of the deposited film were studied. FIG. 9 illustrates the results of these experiments where a TriMOS precursor was accumulated and then was rapidly introduced into the chamber. With the increase of the accumulation time, more TriMOS was accumulated and then released into the chamber leading to the thicker films (i.e., a thickness of the film increases together with the accumulation duration). While thicker films typically have more haze than thinner films, it has been unexpectedly found that the haze values for the thicker films in these experiments were actually lower as could be seen from FIG. 8. Without being restricted to any particular theory, it is believed that the longer accumulation led to the higher pressure differential between the accumulator and the processing chamber and, as a result, more rapid introduction of the TriMOS precursor into the chamber. This in turn led to the target concentration being reached faster and the shorter transition period that caused less hazing.

CONCLUSION

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

What is claimed is:

1. A semiconductor processing apparatus for forming a flowable silicon-containing film on a substrate, the apparatus comprising:
  a processing chamber having a substrate support disposed therein;
  one or more gas inlets to the processing chamber;
  an accumulator connected to at least one of the one or more gas inlets; and
  a controller comprising program instructions for:
    maintaining the substrate support at a temperature between about −20° C. and 100° C.;
    introducing a first process gas into the processing chamber and maintaining the processing chamber at a processing chamber pressure level;
    accumulating a second process gas comprising a silicon-containing compound in the accumulator until the accumulator is at an accumulator pressure level,
      wherein the accumulator pressure level is substantially greater than the processing chamber pressure level; and
    rapidly introducing the second process gas from the accumulator into the processing chamber such that an amount of the second process gas is provided in the processing chamber during the introduction of the second process gas.

2. The semiconductor processing apparatus of claim 1, wherein the program instructions for rapidly introducing the second process gas include instructions for introducing the second process gas into the processing chamber after the first process gas is introduced into the processing chamber.

3. The semiconductor processing apparatus of claim 1, wherein program instructions for accumulating the second process gas comprise program instructions for setting the accumulator pressure level at least 100% greater than the processing chamber pressure level.

4. The semiconductor processing apparatus of claim 1, wherein the program instructions for accumulating the second process gas comprise instructions for accumulating the second process gas until an accumulator pressure delta reaches a minimum level, the accumulator pressure delta being the difference between the pressure in the accumulator and the pressure in the processing chamber.

5. The semiconductor processing apparatus of claim 4, wherein the accumulator pressure delta is at least about 25 Torr.

6. The semiconductor processing apparatus of claim 1, further comprising a second accumulator, and wherein the controller further comprises program instructions for accumulating a third process gas in the second accumulator.

7. The semiconductor processing apparatus of claim 1, wherein the program instructions for introducing the first process gas comprise program instructions for introducing the first process gas at a constant flow rate.

8. The semiconductor processing apparatus of claim 1, wherein the volume of the accumulator is 0.01 or less times the volume of the processing chamber.

9. The semiconductor processing apparatus of claim 1, wherein the program instructions for introducing the first process gas comprises program instructions for introducing an oxidant.

10. The semiconductor processing apparatus of claim 1, wherein the program instructions for introducing the first process gas comprises program instructions for introducing an alcohol.

11. The semiconductor processing apparatus of claim 1, wherein the program instructions for introducing the first process gas comprises program instructions for introducing a gas selected from ozone, hydrogen peroxide, oxygen, water, methanol, ethanol, and isopropanol.

12. A semiconductor processing apparatus for forming a flowable silicon-containing film on a substrate, the apparatus comprising:
   a processing chamber having a substrate support disposed therein;
   one or more gas inlets to the processing chamber;
   an accumulator connected to at least one of the one or more gas inlets; and
   a controller comprising program instructions for:
      maintaining the substrate support at a temperature between about −20° C. and 100° C.;
      introducing a first process gas comprising a silicon-containing compound into the processing chamber and maintaining the processing chamber at a processing chamber pressure level;
      accumulating a second process gas in the accumulator until the accumulator is at an accumulator pressure level,
         wherein the accumulator pressure level is substantially greater than the processing chamber pressure level; and
      rapidly introducing the second process gas from the accumulator into the processing chamber such that an amount of the second process gas is provided in the processing chamber during the introduction of the second process gas.

13. The semiconductor processing apparatus of claim 12, wherein the program instructions for rapidly introducing the second process gas include instructions for introducing the second process gas into the processing chamber after the first process gas is introduced into the processing chamber.

14. The semiconductor processing apparatus of claim 12, wherein program instructions for accumulating the second process gas comprise program instructions for setting the accumulator pressure level to a level at least 100% greater than the processing chamber pressure level.

15. The semiconductor processing apparatus of claim 12, wherein the program instructions for accumulating the second process gas comprise instructions for accumulating the second process gas until an accumulator pressure delta reaches a minimum level, the accumulator pressure delta being the difference between the pressure in the accumulator and the pressure in the processing chamber.

16. The semiconductor processing apparatus of claim 15, wherein the accumulator pressure delta is at least about 25 Torr.

17. The semiconductor processing apparatus of claim 12, further comprising a second accumulator, and wherein the controller further comprises program instructions for accumulating a third process gas in the second accumulator.

18. The semiconductor processing apparatus of claim 12, wherein the program instructions for introducing the first process gas comprise program instructions for introducing the first process gas at a constant flow rate.

19. The semiconductor processing apparatus of claim 12, wherein the volume of the accumulator is 0.01 or less times the volume of the processing chamber.

* * * * *